(12) United States Patent
Juntunen et al.

(10) Patent No.: US 8,605,826 B2
(45) Date of Patent: Dec. 10, 2013

(54) MULTI-GIGABIT MILLIMETER WAVE RECEIVER SYSTEM AND DEMODULATOR SYSTEM

(75) Inventors: Eric Juntunen, Atlanta, GA (US); Stephane Pinel, Atlanta, GA (US); Joy Laskar, Marietta, GA (US); David Yeh, Atlanta, GA (US); Saikat Sarkar, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 334 days.

(21) Appl. No.: 12/850,481

(22) Filed: Aug. 4, 2010

(65) Prior Publication Data
US 2011/0207425 A1  Aug. 25, 2011

Related U.S. Application Data

(60) Provisional application No. 61/231,137, filed on Aug. 4, 2009.

(51) Int. Cl.
*H04L 27/14* (2006.01)
*H04L 27/16* (2006.01)
*H04L 27/22* (2006.01)

(52) U.S. Cl.
USPC ........... 375/326; 375/316; 375/340; 375/329; 375/279; 375/283; 455/334; 455/335; 455/336; 455/337

(58) Field of Classification Search
USPC ......... 375/316, 326, 340, 329–333, 336, 274, 375/279–283; 455/334–337
See application file for complete search history.

(56) References Cited

U.S. PATENT DOCUMENTS

| | | | | |
|---|---|---|---|---|
| 6,229,987 B1* | 5/2001 | Greeff et al. | ................. | 340/10.1 |
| 2007/0133721 A1* | 6/2007 | Wallen et al. | ................. | 375/346 |
| 2007/0184811 A1* | 8/2007 | Ballantyne | ................. | 455/343.2 |
| 2010/0182079 A1* | 7/2010 | Shiue et al. | ................. | 329/304 |
| 2012/0155549 A1* | 6/2012 | Oh | ................. | 375/240.25 |

* cited by examiner

*Primary Examiner* — Phuong Phu
(74) *Attorney, Agent, or Firm* — Dustin B. Weeks, Esq.; Ryan A. Schneider, Esq.; Troutman Sanders LLP

(57) ABSTRACT

A receiver system and a demodulator system are configured to receive and demodulate, respectively, multi-gigabit millimeter wave signals being wirelessly transmitted in the unlicensed wireless band near 60 GHz.

12 Claims, 22 Drawing Sheets

MULTI-GIGABIT MILLIMETER WAVE RECEIVER SYSTEM AND DEMODULATOR SYSTEM

CROSS REFERENCE TO RELATED APPLICATION

This application claims benefit, under 35 U.S.C. §119(e), of U.S. Provisional Application Ser. No. 61/231,137, filed 4 Aug. 2009, the entire contents and substance of which are hereby incorporated by reference.

BACKGROUND

Up until the mid-1990s the wireless communication market was dominated by designs in the III-V semiconductor processes, such as Gallium Arsenide (GaAs) or silicon bipolar technologies. Before that time, complementary metal-oxide semiconductor (CMOS) processes could not achieve the high transit frequencies ($f_T$) required at transmitter/transceiver front ends. But CMOS was and continues to be the clear choice for implementing digital circuits, as it is the lowest cost, high-volume semiconductor fabrication technology available.

Driven by the prospects of lower cost designs through increased integration of analog and digital content on the same chip and the replacement of expensive GaAs front end circuitry with less expensive CMOS implementations, the development of RF CMOS received a great deal of attention.

For example, FIG. 1 illustrates a diagram of conventional transit frequencies for CMOS and Silicon Germanium (SiGe) processes at different technology nodes. Notably, the 90 nm CMOS node with a transit frequency $f_T$ greater than about 140 GHz enables systems operating around 60 GHz to be designed completely in CMOS.

Recently, there has been a growing interest in exploiting the frequency band surrounding 60 GHz for short-range high-data-rate wireless communications. This particular frequency band is gaining popularity because of its high attenuation (10-15 dB/km), which is caused by atmospheric oxygen for a band approximately 8 GHz wide around 60 GHz. Although high attenuation prohibits long distance communication, it enables frequency re-use over short distances. These piconets have radii on the order of a few meters and are standardized by the IEEE 802.15 working group for wireless personal area networks (WPAN).

For instance, in the United States, the Federal Communications Commission (FCC) assigned the 59-64 GHz frequency band for general unlicensed usage. In Japan, the band from 59-66 GHz is regulated for high-speed data communication. In Europe, the 62-63 GHz and 65-66 GHz bands have been provisionally allocated for mobile broadband systems and the 59-62 GHz band is allocated for Wireless Local Area Networks (WLANs).

Referring now to FIG. 2, it illustrates that storage capability of hard drives and other data storage devices is increasing exponentially, and will soon move to the order of terabytes. As this trend continues there is a need for devices facilitating fast data transfer between these devices. The recent spectral allocation around 60 GHz for high-data-rate communications coupled with the recent advances in CMOS processes enabling designs at these frequencies point to fully CMOS systems being a low-cost and commercially viable solution to this challenge.

SUMMARY

Briefly described, embodiments of the present invention relate to a demodulator system. Embodiments of the present invention further relate to a 60 GHz, short-range, low-power, high-data-rate, on-off keying receiver system in a 90 nm CMOS process.

For example, embodiments of the present invention relate to novel design solution for direct-conversion demodulation of a multi-gbps minimum shift keying (MSK), differential binary shift keying (DBPSK), and/or amplitude shift keying (ASK) signals with an approximate 61 GHz carrier. The demodulator system can operate with a low power consumption. For example, in some embodiments, the receiver system consumes approximately 94 mW of power. The components of the demodulator system consumer little power; for example and not limitation, the elements including a low noise amplifier (LNA), mixer, baseband amp, and other digital circuitry consume approximately 58 mW, 6 mW, 15 mW, and 15 mW, respectively.

In one aspect, embodiments of the present invention relate to a receiver system. The receiver system comprises an antenna configured to receive an analog wireless signal; a low noise amplifier adapted to amplify the analog wireless signal and to generate an amplified analog signal; a demodulator system configured to detect the analog characteristics of the amplified analog signal and adapted to generate a demodulated analog signal; a baseband amplifier adapted to amplify the demodulated analog signal; an analog to digital converter configured to convert the amplified, demodulated analog signal to a digital signal; and a clock and data recovery system.

In some embodiments, the analog wireless signal can operate at approximately 60 GHz. In some embodiments, the clock and data recovery system comprises a digital output and a clock output. In some embodiments, the receiver system is adapted for direct conversion demodulation of a gigabit per second minimum shift keying signal with an approximate 61 GHz carrier. In some embodiments, the receiver system is adapted for direct conversion demodulation of a gigabit per second differential binary shift keying signal with an approximate 61 GHz carrier. Yet, in some embodiments, the receiver system is adapted for direct conversion demodulation of a gigabit per second amplitude shift keying signal with an approximate 61 GHz carrier. In some embodiments, the receiver system is adapted at gigabit per second minimum shift keying, differential binary shift keying, or amplitude shift keying reception and demodulation in the unlicensed 57-64 GHz band.

In some embodiments, the receiver system consumes less than approximately 73 mW of power in operation. In an exemplary embodiment, the demodulator system is non-coherent.

In some embodiments, the demodulator system comprises a mixer system adapted to multiply a plurality of inputs and to generating a mixer output; a baseband amplifier configured to amplify the mixer output; and a pair of inverters for inverting an amplified bandband output.

In another aspect of the present invention, a demodulator system is provided. The demodulator system comprises a mixer adapted to multiply a plurality of inputs and generating an output; a baseband amplifier configured to amplify the mixer output; and a pair of inverters for inverting an amplified bandband output.

The demodulator system is adapted for the direct-conversion demodulation of one of minimum shift keying, differential binary phased shift keying, or amplitude shift keying modulated data on an approximate 61 GHz carrier in a single analog CMOS device.

In yet another aspect, the demodulator system comprises a phase shifter configured to shift the phase of one or more inputs and providing at least one phase shifted output; a mixer configured to multiply one or more inputs and providing at least one output; a baseband amplifier configured to amplifying the at least one mixer output and generating at least one output; and an inverter system configured to invert the at least one baseband amplified output; wherein a demodulated minimum shift keying signal is a first output of the demodulated system; and wherein a binary phase shift keying signal is a second output of the demodulated system.

These and other objects, features, and advantages of the present invention will become more apparent upon reading the following specification in conjunction with the accompanying drawings.

DETAILED DESCRIPTION

Figure 1:
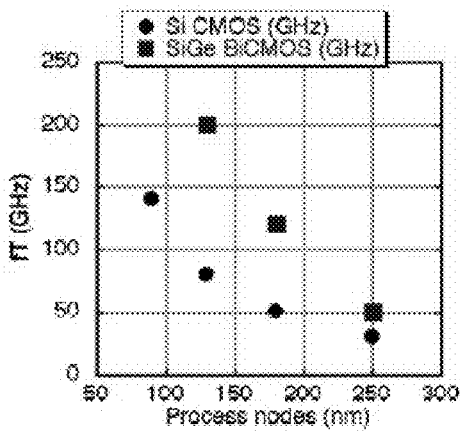
FIG. 1 illustrates a chart illustrating transit frequencies for complementary metal-oxide semiconductor processes and Silicon Germanium processes.
Figure 2:
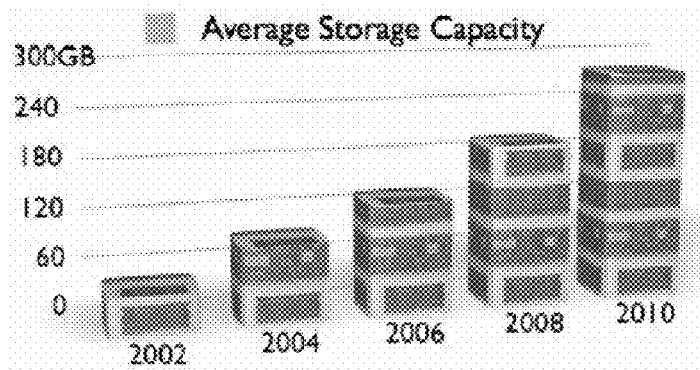
FIG. 2 illustrates a chart that shows expected storage capacity of hard drives between the years 2002 and 2010 A.D.

To facilitate an understanding of embodiments, principles, and features of the present invention, they are explained hereinafter with reference to implementation in illustrative embodiments. In particular, they are described in the context of being a demodulator system; other embodiments are described as a receiver system.

Embodiments of the present invention, however, are not limited to use in the described systems. Rather, embodiments of the present invention can be used to demodulate and/or receive a wireless signal.

The components described hereinafter as making up the various embodiments are intended to be illustrative and not restrictive. Many suitable components that would perform the same or a similar function as the materials described herein are intended to be embraced within the scope of embodiments of the present invention.

Referring now to the figures, wherein like reference numerals represent like parts throughout the views, embodiments of the present invention will be described in detail.

Figure 3:
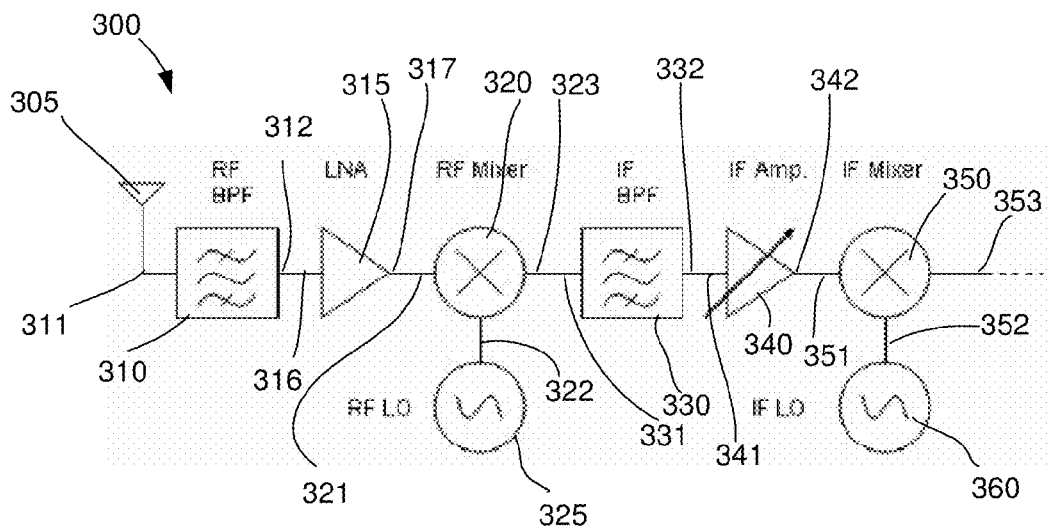
FIG. 3 illustrates a schematic of a super-heterodyne receiver system, in accordance with an exemplary embodiment of the present invention.

FIG. 3 illustrates a block diagram of a superheterodyne receiver, in accordance with exemplary embodiments of the present invention. The two fundamental classes of receiver front end architectures are superheterodyne and direct-conversion.

As shown in FIG. 3, the superheterodyne receiver system 300 comprises an antenna 305 configured to receive a wireless signal, a radio frequency bandpass filter (RF BPF) 310, a low noise amplifier (LNA) 315, a RF mixer 320, a radio frequency local oscillator (LO) 325, a intermediate frequency bandpass filter (IF BPF) 330, an IF amplifier 340, a IF mixer 350, and a IF LO 360.

In the receiver system 300 shown in FIG. 3, a wireless signal can be received by the antenna 305. In some embodiments, the antenna 305 can be calibrated to receive a wireless signal being transmitted within a range of approximately 55 GHz to approximately 66 GHz. In some embodiments, the antenna 305 can be calibrated to receive a wireless signal being transmitted at about 60 GHz. The received signal is transmitted from the antenna 305 to a first bandpass filter (BPF) 310.

The first bandpass filter 310 can be a RF BPF. The RF BPF 310 includes an input 311, which receives the received signal transmitted from the antenna 305, and an output 312. The RF BPF 310 is adapted to filter the received radio frequency from the antenna 305. The RF BPF 310 can be configured to pass frequencies within a certain range and rejects, or attenuates, frequencies outside that range. The output 312 of the RF BPF 310 is transmitted to an input 316 of a low noise amplifier (LNA) 315.

Figure 15:
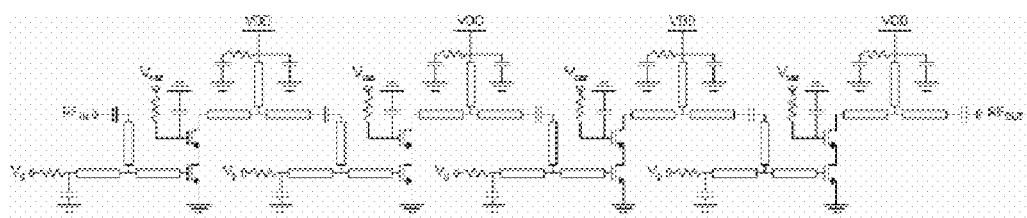
FIG. 15 illustrates a schematic of a 60 GHz low noise amplifier, in accordance with an exemplary embodiment of the present invention.
Figure 16:
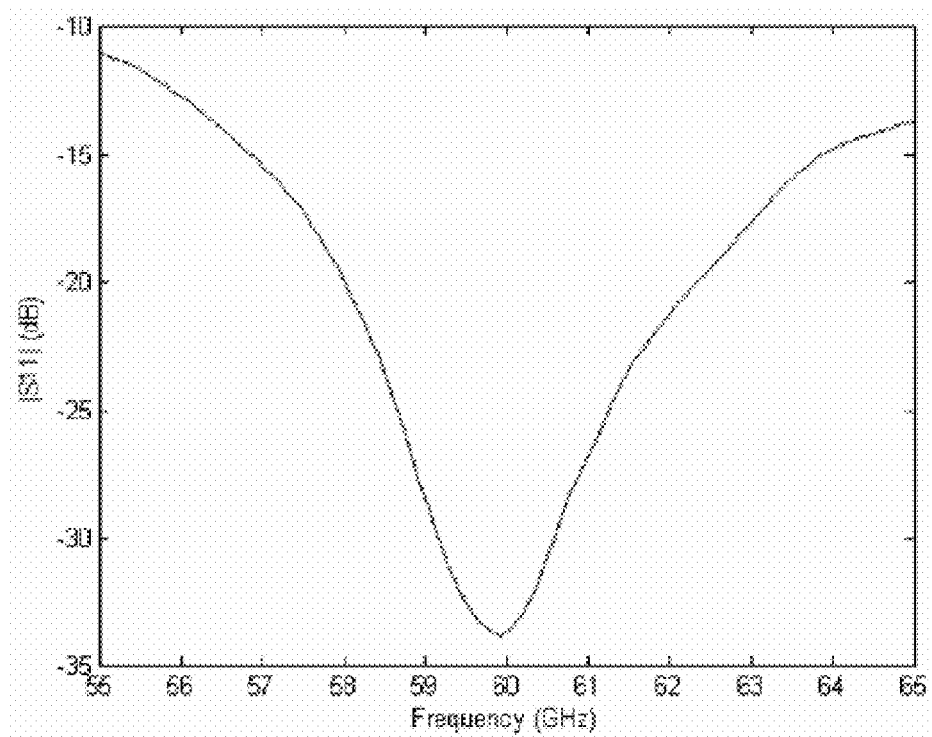
FIG. 16 illustrates a graphical representation of a simulation $|S_{11}|$ for the 60 GHz low noise amplifier of FIG. 15, in accordance with an exemplary embodiment of the present invention.
Figure 17:
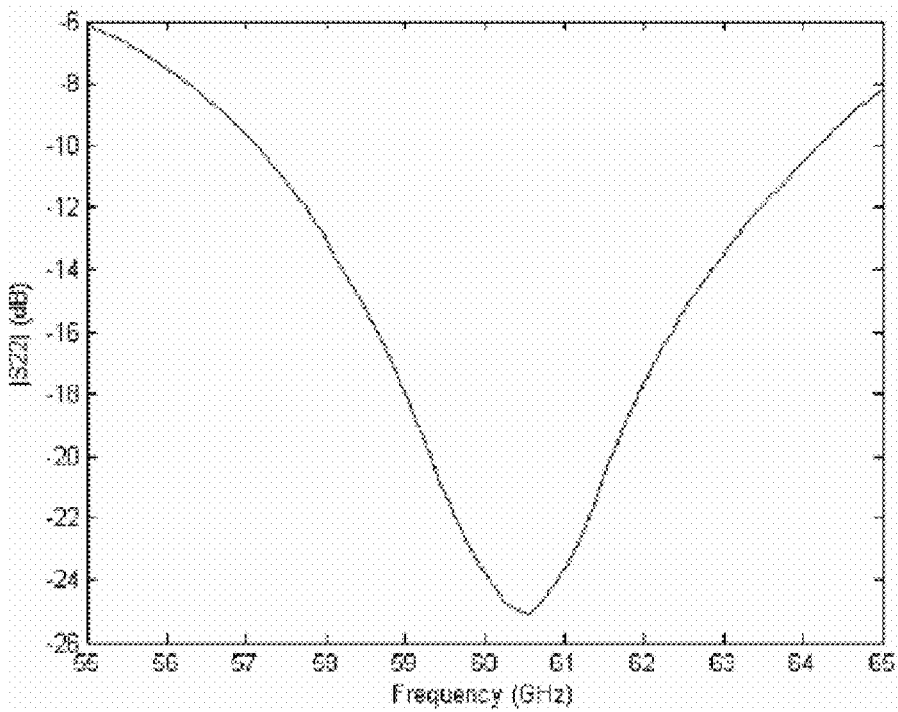
FIG. 17 illustrates a graphical representation of a simulation $|S_{22}|$ for the 60 GHz low noise amplifier of FIG. 15, in accordance with an exemplary embodiment of the present invention.
Figure 18:
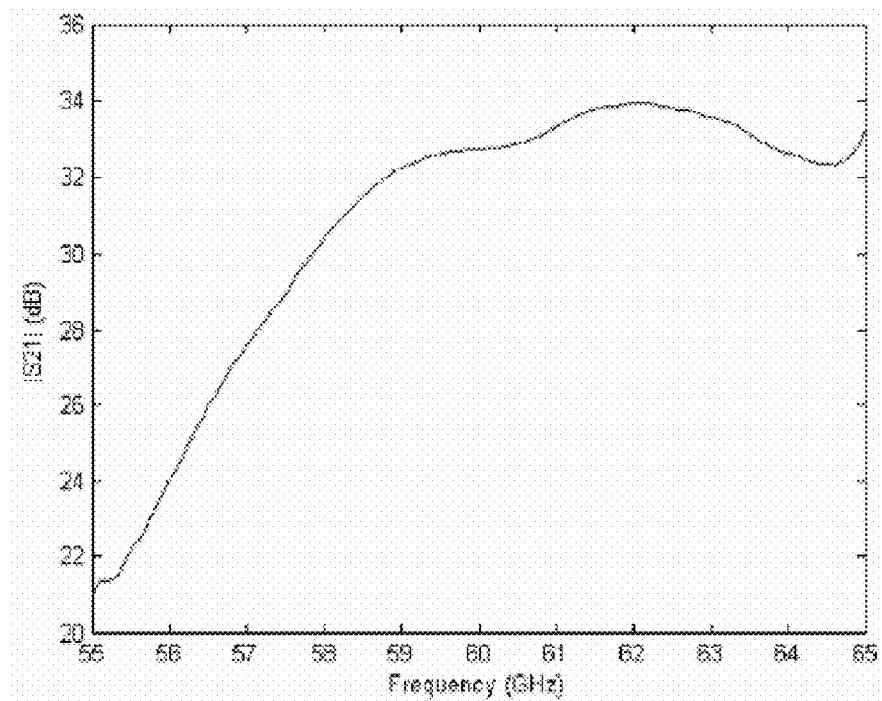
FIG. 18 illustrates a graphical representation of a simulation $|S_{21}|$ for the 60 GHz low noise amplifier of FIG. 15, in accordance with an exemplary embodiment of the present invention.
Figure 19:
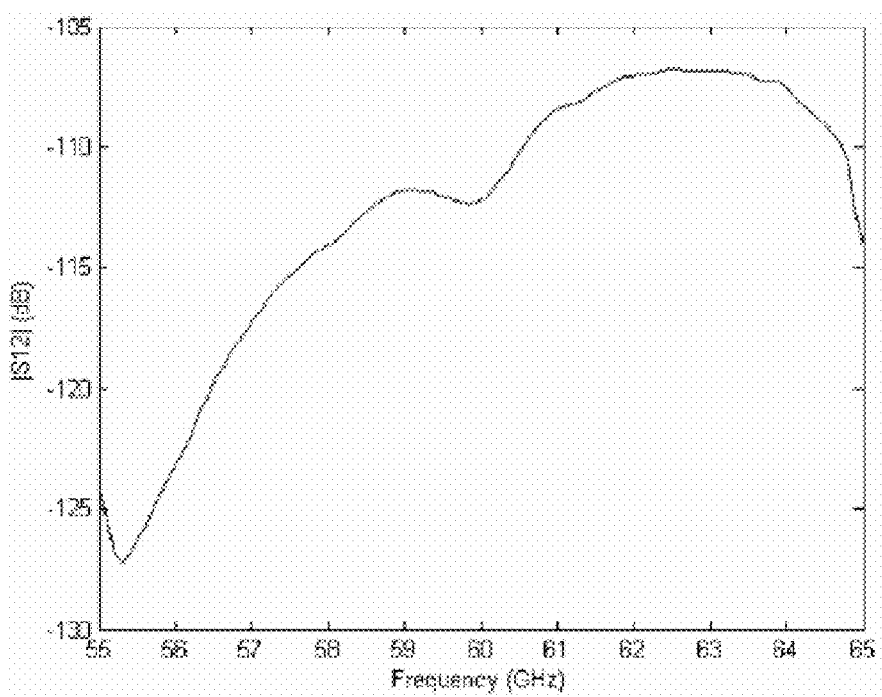
FIG. 19 illustrates a graphical representation of a simulation $|S_{12}|$ for the 60 GHz low noise amplifier of FIG. 15, in accordance with an exemplary embodiment of the present invention.

The LNA includes the input 316 and an output 317. The LNA 315 is configured to amplify the filtered signal of the RF BPF 310. An exemplary embodiment of the LNA 315 is illustrated in FIG. 15. The output 317 of the LNA 315 is transmitted to a RF mixer 320.

Figure 20:
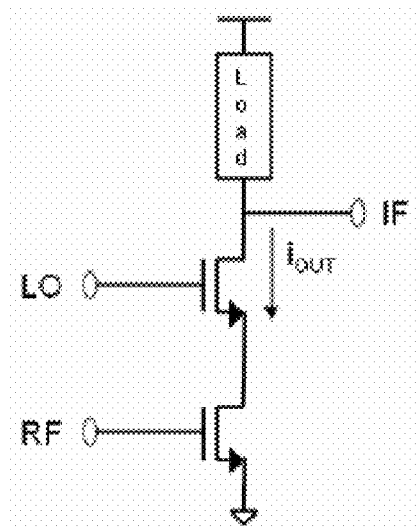
FIG. 20 illustrates a schematic of a dual gate mixer, in accordance with an exemplary embodiment of the present invention.

The RF mixer 320 includes a first input 321, a second input 322, and an output 323. An exemplary embodiment of the mixer 320 is illustrated in FIG. 20. The RF mixer 320 is configured to combine two or more signals to a single output signal 323. The RF mixer 320 can multiply its two input signals 321 and 322 to produce the output 323. The output 317 of the LNA 315 is in communication with the first input 321 of the RF mixer 320. The second input 322 is in communication with a RF local oscillator 325. The local oscillator 325 provides a repetitive variation, e.g., a clock signal, of some measure about a central value or between two or more states. The RF mixer 320 can multiply the output 317 of the LNA 315 and the output 322 of the local oscillator 325. The output 323 of the RF mixer 320 is in communication with a second bandpass filter 330.

The second bandpass filter 330 can be an intermediate frequency bandpass filter (IF BPF). The IF BPF 330 includes an input 331 and an output 332. The IF BPF 330 can filter the mixed signal 323. The output 332 of the IF BPF 330 is in communication with an amplifier 340.

The amplifier 340 includes an input 341 and an output 342. The amplifier 340 can be an IF amplifier. The amplifier 340 is configured to amplify the output 332 of the IF BPF 330. The output 342 of the amplifier 340 can be in communication with an IF mixer 350.

The IF mixer 350 is configured to mix two input signals. The IF mixer 350 includes two inputs 351 and 352, and an output 353, and is configured to mix the signal of the two inputs 351 and 352. The output 353 of the IF mixer 350 can be the output of the receiver system 300.

In the topology of FIG. 3, the incoming RF signal is down-converted to an intermediate frequency (IF), which is the difference between the RF and Local Oscillator (LO) frequencies, with the LO frequency typically being the smaller of the two. For instance, the IF signal equals the difference of the RF signal and the LO signal.

$$\omega_{IF}=\omega_{RF}-\omega_{LO} \quad (1)$$

But as a result of trigonometric multiplication, a signal residing at the sum of the two input frequencies can also be present at the output of the RF mixer.

$$\omega_{High} = \omega_{LO} + \omega_{RF} \quad (2)$$

This signal can be removed either by explicit filtering or from the bandpass nature of the following stage. Additionally, the image frequency ($W_{IM}$) can be rejected before the first down conversion. This may require filtering between the antenna and the low noise amplifier.

$$\omega_{IM} = \omega_{LO} - \omega_{IF} \quad (3)$$

One advantage of a super-heterodyne receiver is that the IF can be selected, such that it is above a flicker noise corner of the technology. The IF can then be sampled and demodulated by a digital signal processor (DSP). Accordingly, more complex modulation schemes with higher spectral efficiencies may be used. Also, because the receiver chain is longer, there is less gain required per stage thereby increasing the inherent stability and linearity of the chain. The disadvantage of super-heterodyne architectures is an increase in complexity that may result from necessary additional image rejection techniques such as a Hartley or Weaver configuration. Furthermore, analog to digital conversion at the IF increases the sampling speed required of the ADC. Both of these approaches can likely lead to increased power consumption.

Figure 4:
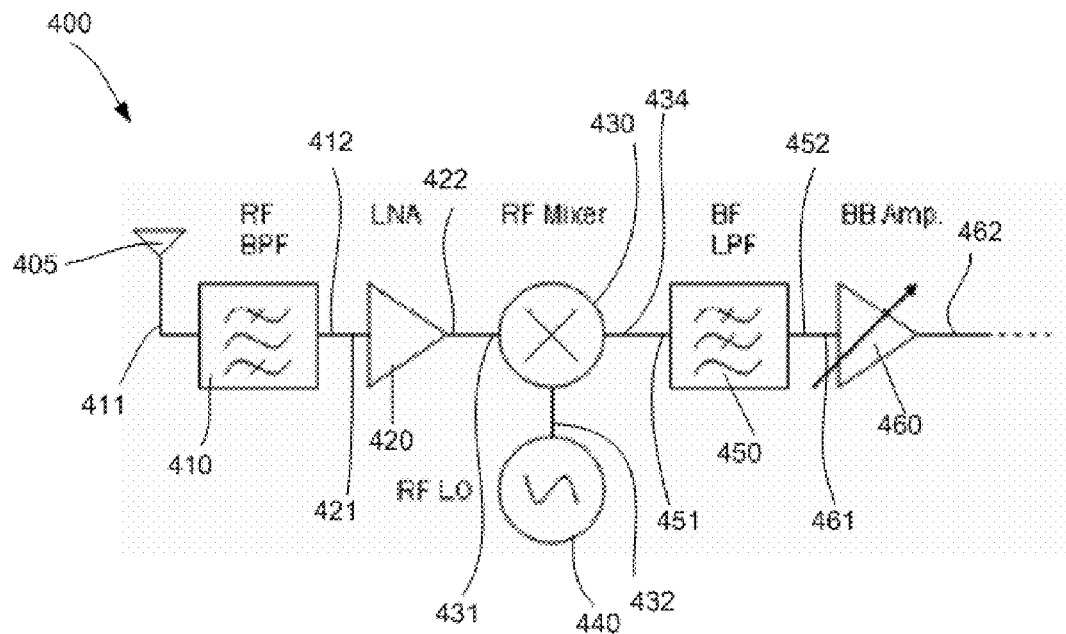
FIG. 4 illustrates a schematic of a direct-conversion receiver system, in accordance with an exemplary embodiment of the present invention.

In a direct-conversion receiver, as shown in FIG. 4, the LO frequency approximately equals the RF frequency resulting in a DC (or zero-frequency) signal and a $2w_{RF}$ signal at the mixer output. This reduces, or in some cases eliminates, the need for image frequency rejection, because the RF signal and the image frequency are approximately the same. The $2w_{RF}$ signal can be rejected by a low pass filter or simply a low pass response in the baseband.

As mentioned, FIG. 4 illustrates a schematic of a direct-conversion receiver system 400. The direct-conversion system includes an antenna 405, a first bandpass filter 410, a LNA 420, a RF mixer 420, a RF local oscillator 430, a BF LPF 440, and a BB Amplifier 450.

The antenna 405 of the receiver system 400 is configured to receive a wireless signal. The antenna 405 can be configured to receive a wireless signal between about 55 GHz and about 66 GHz. In some embodiments, the antenna 405 can be configured to receive a wireless signal operating at approximately 60 GHz. The received signal from the antenna 405 can be transmitted to the first bandpass filter 410.

The first bandpass filter 410 can be a RF BPF. The RF BPF 410 includes an input 411, which receives the received signal transmitted from the antenna 405, and an output 412. The RF BPF 410 is adapted to filter the received radio frequency from the antenna 405. The RF BPF 410 can be configured to pass frequencies within a certain range and rejects, or attenuates, frequencies outside that range. The output 412 of the RF BPF 410 is transmitted to a low noise amplifier (LNA) 420.

The LNA 420 includes the input 421 and an output 422. An exemplary embodiment of the LNA 420 is illustrated in FIG. 15. The LNA 420 is configured to amplify the filtered signal of the RF BPF 410. The output 422 of the LNA 420 is transmitted to a RF mixer 430.

The RF mixer 430 includes a first input 431, a second input 433, and an output 434. An exemplary embodiment of the mixer 430 is illustrated in FIG. 20. The RF mixer 430 is configured to combine two or more signals to a single output signal 434. The RF mixer 430 can multiply its two input signals 431 and 433 to produce the output 434. The output 422 of the LNA 420 is in communication with the first input 431 of the RF mixer 430. The second input 433 is in communication with a RF local oscillator 440. The local oscillator 440 provides a repetitive variation, e.g., a clock signal, of some measure about a central value or between two or more states. The RF mixer 430 can multiply the output of the LNA 420 and the output of the local oscillator 420. The output 434 of the RF mixer 430 is in communication with a low pass filter 450.

The low pass filter 450 includes an input 451 and an output 452. The LPF 450 can filter the mixed signal 434. The output 452 of the LPF 450 is in communication with an amplifier 460.

Figure 30:
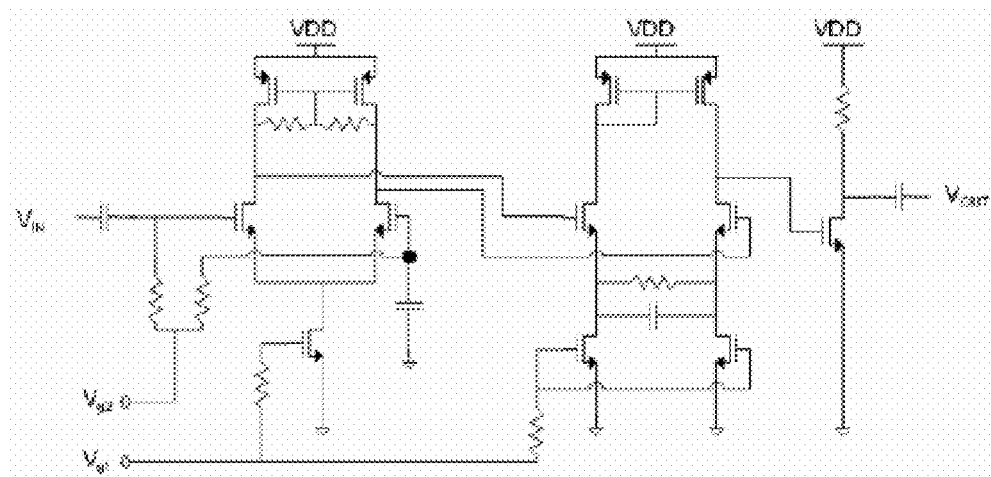
FIG. 30 illustrates a schematic of a baseband amplifier, in accordance with an exemplary embodiment of the present invention.

The amplifier 460 includes an input 461 and an output 462. In an exemplary embodiment, the amplifier 460 is a baseband amplifier. An exemplary embodiment of the amplifier 460 is illustrated in FIG. 30. The amplifier 460 is configured to amplify the output 462 of the LPF 450. The output 462 of the amplifier 460 is the output of the receiver system 400.

In an exemplary embodiment of the present invention, after downconversion, the signal resides at DC. It is therefore subject to flicker noise, which is high in CMOS. Generally, this is less of an issue for gigabit per second data rates because flicker noise corners for sub-micron CMOS are typically in vicinity of the low megahertz. Reducing the number of active devices in the baseband can reduce, or in some cases avoid, prohibitive noise degradation. But this may require a higher gain in the front end that may compromise receiver stability and linearity. Another problem is that the LO signal can leak to the mixer input leading to self-mixing and resulting in time-varying DC offset in the baseband. These phenomena can result in poorer performance of direct-conversion receivers as compared to super-heterodyne implementations. But if acceptable performance can still be achieved with direct-conversion architecture its benefits can be reduced complexity and consequently can have a lower power consumption.

The lower power consumption and complexity resulted in a direct-conversion architecture receiver. As mentioned, the linearity penalty includes a rather simple modulation scheme to be implemented. An OOK modulation may be desirable, because it may require a simple demodulation scheme in the form of an amplitude detector. One option is to perform coherent demodulation, whereby the incoming waveform is multiplied by locally generated 60 GHz signal. This may require that an approximate 60 GHz LO controlled by a phase locked loop (PLL) drive the downconversion mixer. An LO/PLL can have a power consumption comparable to the power requirement of the other receiver elements combined. Alternatively, if a power detector can be implemented at about 60 GHz, then non-coherent demodulation can obviate the need for an LO and PLL. The non-coherent demodulation can have poor conversion gain, but can offer savings in power consumption and chip area.

Embodiments of the present invention relate to a receiver adapted to perform non-coherent direct-conversion demodulation. By implementing a receiver with coherent direct-conversion demodulation, this can reduce DC power and complexity, because no LO or synchronization scheme, typically in the form of a PLL, may be required. But, the penalty can be high conversion loss in the demodulator.

Figure 5:
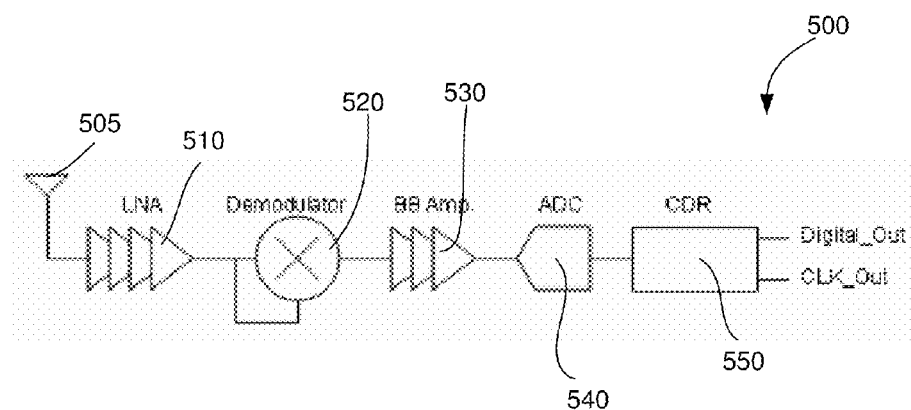
FIG. 5 illustrates a schematic of a receiver system, in accordance with an exemplary embodiment of the present invention.

Referring now to FIG. 5, a schematic of a receiver system 500 is illustrated. The receiver system 500 includes an antenna 505, a low noise amplifier 510 (see also FIG. 15), a demodulator system 520 (see also FIG. 38), an amplifier 530 (see also FIG. 30), an analog to digital converter 540, and a clock data recovery system 550 (see also FIG. 37).

The antenna 505 is configured to receive a wireless signal. The antenna 505 can be adapted to receive a wireless signal operating between about 55 GHz and about 66 GHz. In some embodiments, the antenna 505 is adapted to receive a signal at approximately 60 GHz. The received signal 505 is in communication with a low noise amplifier 510.

The low noise amplifier 510 includes an input 511 and an output 512. An exemplary embodiment of the low noise amplifier 510 is illustrated in FIG. 15. The received signal 505 can be transmitted to the input 511 of the low noise amplifier 510. The low noise amplifier 510 can amplify the received signal. The output 512 is in communication with a demodulator system 520.

Figure 37:
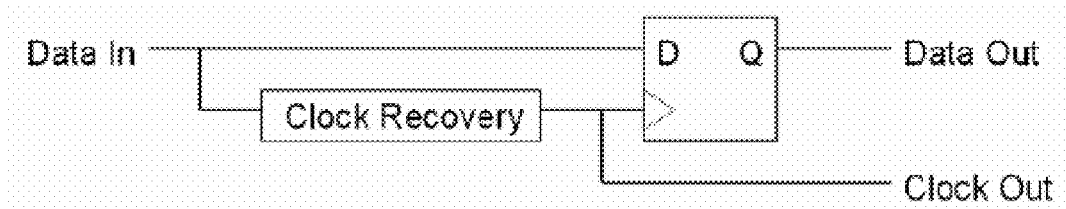
FIG. 37 illustrates a schematic of a clock data recovery system, in accordance with an exemplary embodiment of the present invention.

The demodulator system 520 includes two inputs and an output 522. The output 522 of the demodulator system 520 is in communication with the amplifier 530. In an exemplary embodiment, the amplifier 530 can be a baseband amplifier. An exemplary embodiment of the amplifier 530 is illustrated in FIG. 30. The output of the amplifier remains as an analog signal and is converted to a digital signal with an analog to digital converter 540. The converted digital signal is fed to a clock and data recovery 550, which outputs a digital output and a clock output. An exemplary embodiment of the clock and data recover 550 is illustrated in FIG. 37.

As illustrated in FIG. 5, the first element in a downconverting system is a high gain 60 GHz LNA 510. Because the demodulator system 520 may be lossy, a high gain from the LNA 510 can minimize the noise penalty for having a lossy element in the front end. The 60 GHz direct-conversion demodulator system 520 can convert the incoming OOK modulated millimeter-wave signal to an analog baseband signal. Next, the baseband amplifier 530 can increase the signal swing so that it can be successfully captured by the ADC 540 and converted to digital data. A large DC system of capacitors can be used in the baseband to alleviate the DC offset issue caused by direct-conversion. Finally, the digital data can be processed by a clock and data recovery system 550, in case the data can be clocked when interfacing with a back end processor.

Table I shows the cascaded receiver chain performance for the system of embodiments of the present invention. The performances of each block are those achieved for the individual blocks in simulation with realistic loading from the adjacent stages.

In Table I, the cascaded noise figure (NF) (4) is found to be approximately 7.8 dB based upon the well known Friis Equation (5) where $F_X$ and $G_X$ are the noise factor and gain for an individual stage, respectively.

$$NF = 10\log(F) \quad (4)$$

$$F_{Total} = F_1 + \frac{F_2 - 1}{G_1} + \frac{F_3 - 1}{G_1 G_2} + \frac{F_4 - 1}{G_1 G_2 G_3} + \ldots \quad (5)$$

TABLE I

Receiver system performance and cascaded noise

|  | LNA | Demodulator | BB Amp. |
|---|---|---|---|
| Gain (dB) | 40 | −15.5 | 21 |
| Noise Figure (dB) | 7.5 | 21 | 10 |
| Cascaded NF (dB) | 7.5 | 7.6 | 7.8 |

For a Bit Error Rate (BER) of approximately $10^{-5}$ for non-coherent OOK modulation, the energy per bit to noise power spectral density ratio ($E_b/N_0$) is approximately 14.4 dB. Using (6) and (7) with a bit rate of approximately 1.728 Gbps and a roll off factor of approximately 0.4245 the signal to noise ratio (SNR) at the baseband is about 10 dB.

$$\text{Occupied Bandwidth, } B = \text{bitrate}(1 + \text{roll off factor}) \quad (6)$$

$$SNR = \frac{E_b}{N_o}\left(\frac{\text{bitrate}}{B}\right) \quad (7)$$

The receiver sensitivity ($P_{RX}$) is calculated by (8) where 10 log (kT)=−174 dBm/Hz is the thermal noise power spectral density at the input. For a noise figure of about 7.8 dB, $P_{RX}$ is about −62.4 dBm.

$$P_{RX} = 10\log(kT) + 10\log(B) + NF + SNR \quad (8)$$

For a receiver gain of about 45.5 dB, this can result in about a −26.9 dBm signal at the ADC input. In order for the ADC to perform reliable conversion, it may desire about a −16 dBm equivalent output from the baseband amplifier. Using this value and the gain of the preceding stages, the $P_{RX}$ is about −51.5 dBm. Therefore, the limiting factor in this receiver is the gain and not the signal to noise ratio (SNR).

Using these receiver requirements along with reasonable estimates for a 60 GHz transmitter, a link budget can be formulated. By using (9) the equivalent isotropic radiated power (EIRP) of the transmitter can be calculated, where $P_{out}$ is the transmitter maximum power output, IL is the implementation loss occurring from packaging effects such as wire bonding, and $G_{aTx}$, is the antenna gain of the transmitter.

$$EIRP = P_{out} + G_{a,Tx} - IL \quad (9)$$

Output $P_{1\text{-}dB}$ values of greater than 6 dBm for 60 GHz CMOS power amplifiers are possible. Gain values of greater than about 7 dBi from compact 60 GHz patch antennas are also possible. Therefore, assuming no implementation loss, an EIRP of about 14 dBm can be calculated. Equation (10) gives the path loss (PL) of the transmitted signal for an indoor environment. The first two terms of (10) are the free space loss at a reference distance $d_0$ and the path loss exponent n (which is empirically derived and is typically between about 1.2 and 4.4) at a relative distance d. As is typical in initial theoretical calculations, n is taken to be 2, which is equivalent to using the first term where the loss increases by the distance squared. The third term can be added to account for additional loss caused by various obstructions such as furniture and is not used in this analysis.

$$PL = 20\log\left(\frac{4\pi d_0}{\lambda}\right) + 10n\log\left(\frac{d}{d_0}\right) + \sum_q^Q X_q \quad (10)$$

Figure 6:
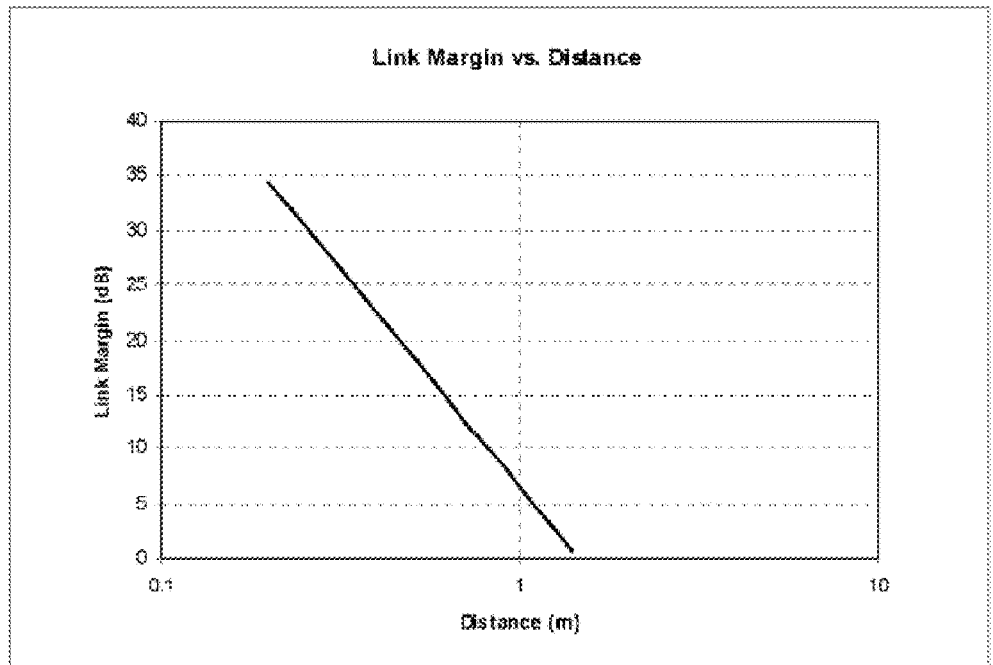
FIG. 6 illustrates a graphical representation of a receiver link margin versus distance, in accordance with an exemplary embodiment of the present invention.

Knowing the EIRP, $G_{aRx}$, PRx, PL, and neglecting the small scale fading loss, the link margin (M) can be calculated by (11). FIG. 6 shows a plot of the link margin versus distance of the receiver system. The receiver's application can be for high data-rate, very low power wireless links of less than 1 meter.

$$M = EIRP - PL + G_{a,Rx} - P_{RX} \quad (11)$$

Figure 7:
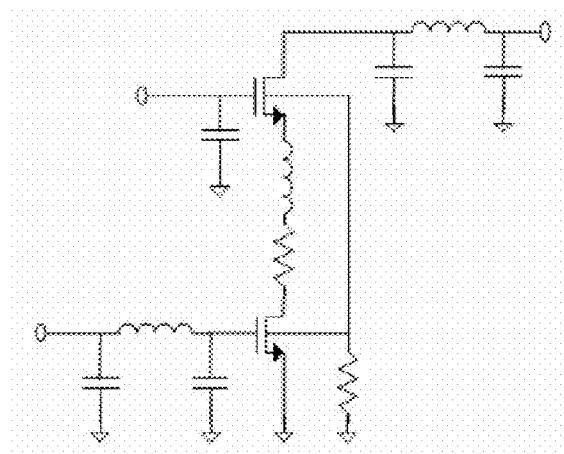
FIG. 7 illustrates a schematic of a cascode structure showing parasitic elements, in accordance with an exemplary embodiment of the present invention.
Figure 8:
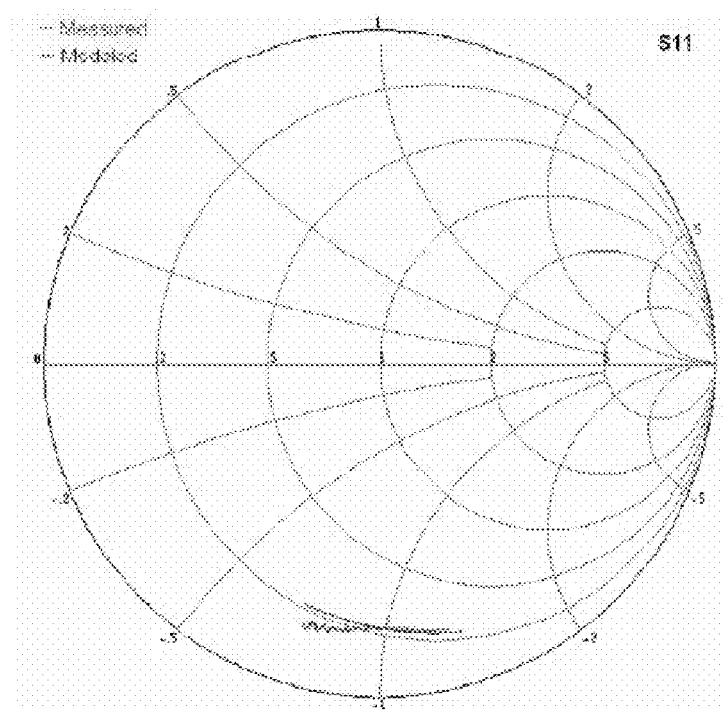
FIG. 8 illustrates a graphical representation of a cascode measured versus a modeled $S_{11}$ from approximately 35 GHz to 65 GHz, in accordance with an exemplary embodiment of the present invention.
Figure 9:
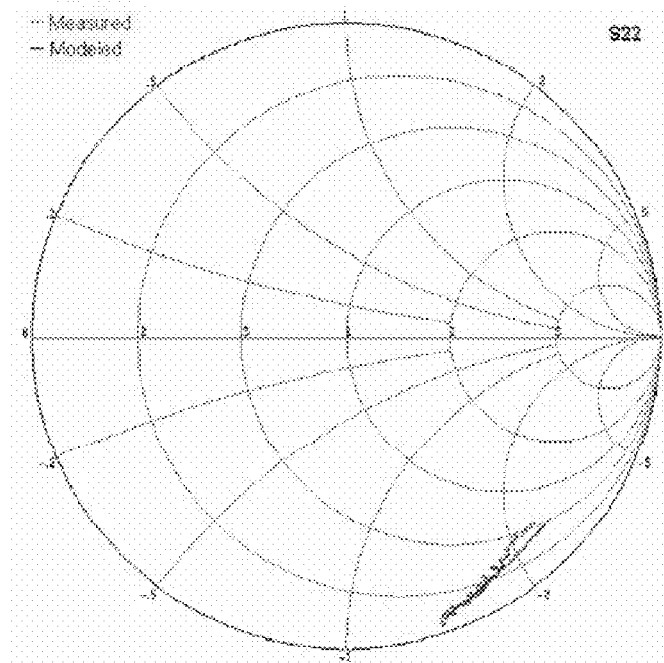
FIG. 9 illustrates a graphical representation of a cascode measured versus a modeled $S_{22}$ from approximately 35 GHz to 65 GHz, in accordance with an exemplary embodiment of the present invention.
Figure 10:
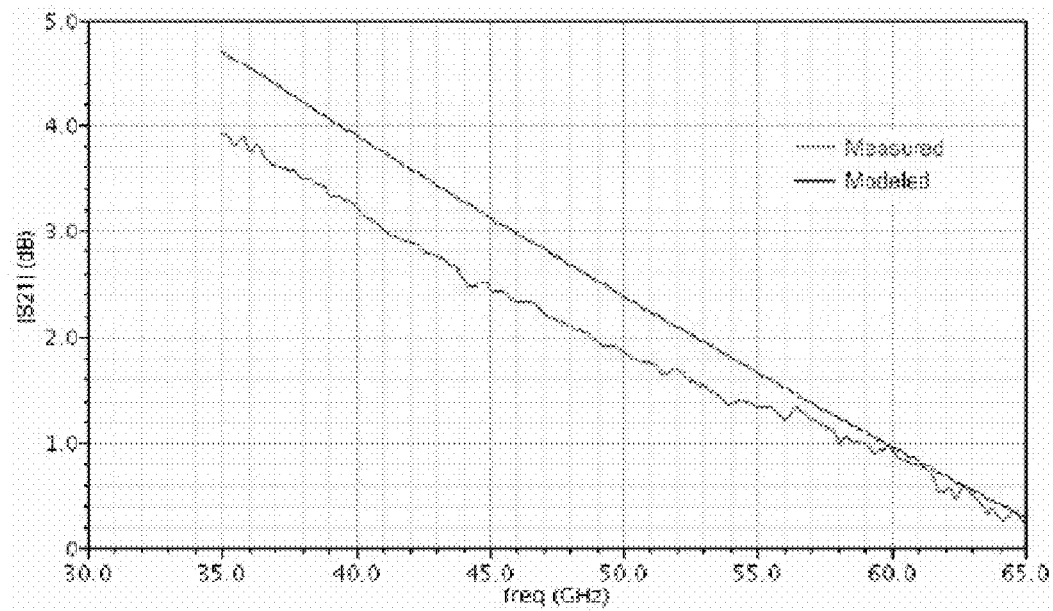
FIG. 10 illustrates a graphical representation of a cascode measured versus a modeled $|S_{21}|$ from approximately 35 GHz to 65 GHz, in accordance with an exemplary embodiment of the present invention.
Figure 11:
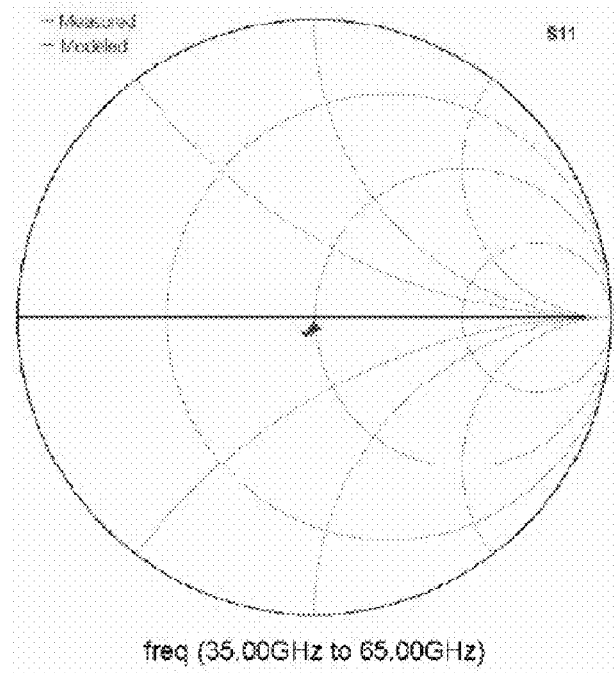
FIG. 11 illustrates a graphical representation of a measured versus modeled $S_{11}$ for an approximate 600 μm microstrip transmission line, in accordance with an exemplary embodiment of the present invention.
Figure 12:
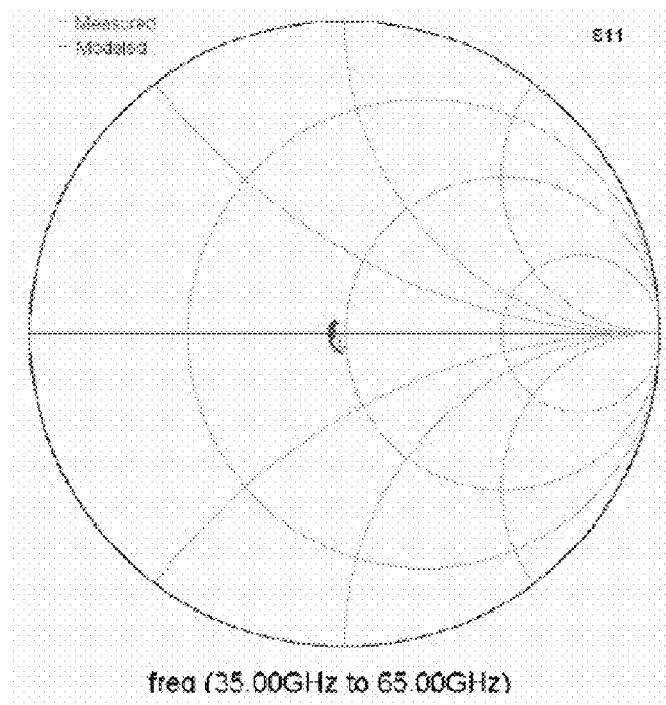
FIG. 12 illustrates a graphical representation of a measured versus modeled $S_{11}$ for an approximate 1000 μm microstrip transmission line, in accordance with an exemplary embodiment of the present invention.
Figure 13:
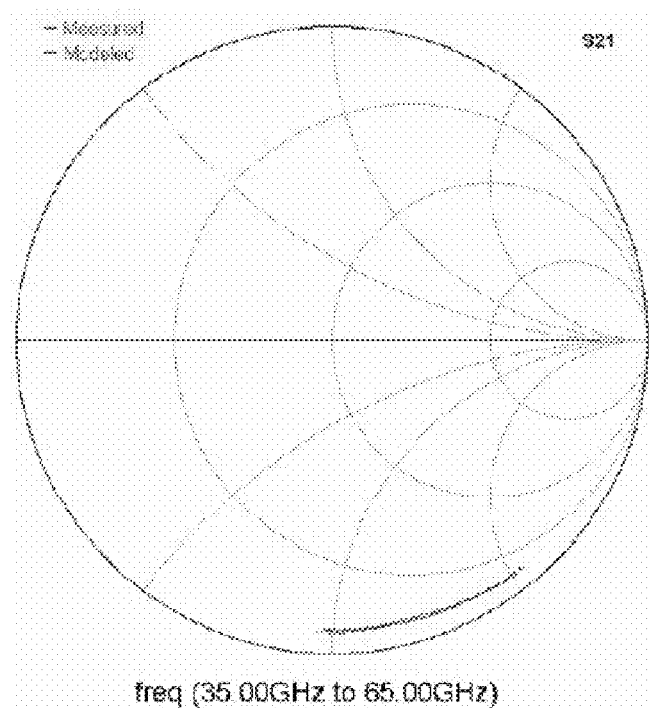
FIG. 13 illustrates a graphical representation of a measured versus modeled $S_{21}$ for an approximate 600 μm microstrip transmission line, in accordance with an exemplary embodiment of the present invention.
Figure 14:
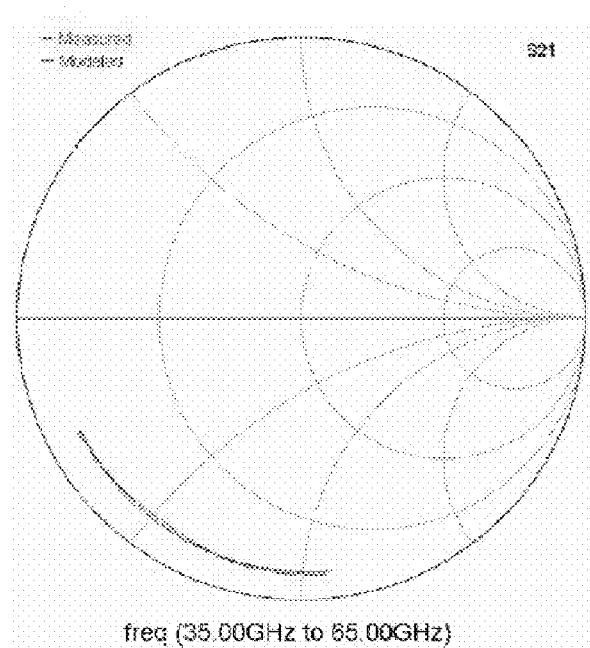
FIG. 14 illustrates a graphical representation of a measured versus modeled $S_{21}$ for an approximate 1000 μm microstrip transmission line, in accordance with an exemplary embodiment of the present invention.

Design kits used with Cadence can consider the intrinsic parasitic resistances and capacitances found in parameterized transistor cells. This, however, does not account for extrinsic parasitic elements arising from circuit layout interconnects. Several parasitic resistance and capacitance extraction tools such as Calibre can be supported by the Cadence platform and are useful in predicting bandwidth degradation and the like during post-layout. At millimeter-wave frequencies, however, parasitic inductances should be taken into account. As with many front-end designs, it is helpful to begin with accurate device impedance information to develop matching networks. Therefore modeling based on measurement is superimposed upon device models inherent to the schematic circuit elements of the design kit. FIG. 7 shows a cascode structure used for the design of 60 GHz circuits with parasitic elements included. FIGS. 8-10 show the measured device parameters alongside STMicroelectronics device models with additional parasitic elements included.

With accurately modeled input and output impedances, this cascade device can now be implemented in a millimeter-wave circuit design.

Also of importance to a millimeter-wave design is the transmission line modeling. Transmission lines are microstrip implementations using a thick metal seven signal line and a metal one ground plane. A microstrip implementation can perform better than a co-planar waveguide transmission line, because it can exhibit less loss.

Using measured results of 600 μm and 1000 μm microstrip transmission lines, substrate and transmission line models were developed for use in ADS and Cadence environments. Both software packages provide schematic elements where quantities such as dielectric constant, loss tangent, substrate geometry, etc. can be specified to effectively model distributed elements. FIGS. 11-14 show the measured versus modeled $S_{ii}$ and $S_{21}$ for 600 μm and 1000 μm microstrip lines.

The receiver system can include a high gain LNA as the first element in the downconversion chain. FIG. 15 shows a schematic diagram of an exemplary LNA.

The topology of the LNA can include a plurality of stages. For example, as illustrate din FIG. 15, four stages can be implemented in the LNA, wherein each stage uses a cascode device. Cascode devices can be used to achieve a high gain per stage, while maintaining a stable design. Cascodes can have a higher noise figure than common-source devices; however, this system is limited by gain, not by noise figure. Conjugate to about 50Ω matching can be used at the input and output of each stage. Short circuit stub matching networks can be used so that the gate and drain biases can be brought via the stubs of the input and output matching networks, respectively, of each stage.

Conjugate matching may be selected instead of noise matching, because the inventors discovered that at millimeter-wave frequencies, noise matching provides minimal improvement over a conjugate match but has a sizable gain penalty. The approach to minimize noise can include selecting a device, sized such that the optimum noise matching and power matching impedances, which are close to each other and to operate the devices at a current density of about 0.2 mA/μm, and which can be optimal in terms of noise performance and maximum frequency of oscillation ($f_{MAX}$). In addition, reducing the DC power consumption also determines the choice of the transistor size. RC networks at the sub ends can provide protection against low frequency oscillation.

FIGS. 16-19 show simulated s-parameters of the LNA of FIG. 15. An input return loss greater than about 12 dB was achieved from 57 GHz to 64 GHz, covering the entire unlicensed 60 GHz band in the United States. An output return loss greater than about 8 dB was achieved for the same band. Simulated $|S_{21}|$ is approximately 44 dB at 60 GHz, leaving margin for post-fabrication degradation while still meeting block specifications. In some embodiments, the LNA draws about 44 mA from a 1.9 V supply.

A single demodulator system can be configured to extract baseband data from a 60 GHz carrier, e.g., a carrier that is modulated by OOK. In some embodiments, the circuit can also demodulate differential binary phase shift keying (DBPSK) and frequency shift keying (FSK) signals. The system is loosely based upon the well-known dual gate mixer structure, as shown in FIG. 20. A discussion of basic mixer theory follows.

In the system of FIG. 20, the input signals to the LO and RF ports can be multiplied together. If we assume they are sinusoidal, the output current seen by the load is:

$$i_{out} = gmV_{RF}\sin(\omega_{RF}t+\phi)V_{LO}\sin(\omega_{LO}t) \quad (12)$$

where $\phi$ denotes the phase difference between the RF and LO signals. Expanding the trigonometric multiplication yields:

$$i_{OUT} = gm\frac{V_{RF}V_{LO}}{2}[\cos((\omega_{RF} - \omega_{LO})t + \phi) - \cos((\omega_{RF} + \omega_{LO})t + \phi)] \quad (13)$$

Because this is can be a downconversion mixer, the high frequency term is filtered out. Also, because this can be used in a direct-conversion scheme $w_{RF}=w_{LO}$ yielding:

$$i_{OUT} = gm\frac{V_{RF}V_{LO}}{2}\cos(\phi) \quad (14)$$

Therefore, a DC output signal can be generated that is approximately proportional to the RF input amplitude, multiplied by the LO input amplitude, and the phase difference between the RF an LO signals. Both of these properties can be utilized when designing the demodulator. The conversion gain is proportional to the LO amplitude as seen by:

$$\frac{A_{OUT}}{A_{IN}} = \frac{I_{OUT} \cdot R_{OUT}}{V_{RF}} \quad (15)$$

$$= gm\frac{V_{RF}V_{LO}}{2} \cdot R_{OUT} \cdot \frac{1}{V_{RF}} \quad (16)$$

$$= V_{LO}\left[\frac{gm \cdot R_{OUT}}{2}\right] \quad (17)$$

For this detector, instead of mixing the RF signal with an LO signal, it can be mixed with itself to enable direct-conversion demodulation.

Figure 21:
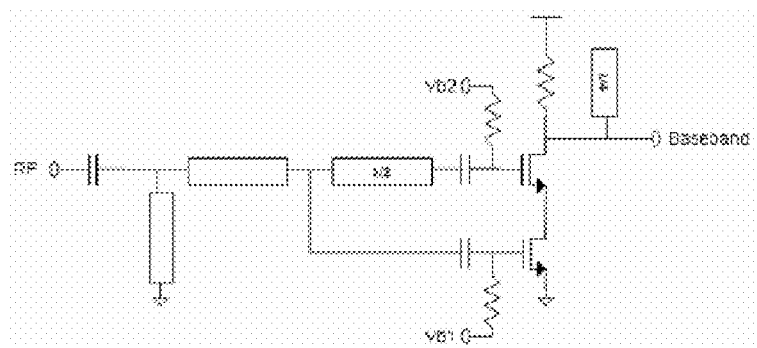
FIG. 21 illustrates a schematic of a demodulator system adapted to operate at approximately 60 GHz, in accordance with an exemplary embodiment of the present invention.

As shown in FIG. 21, distributed elements can be added to the system shown in FIG. 20—an input matching network, a λ/2 series transmission line at the LO port and a λ/4 open-circuit stub at the output, where λ is the guided wavelength of the 60 GHz carrier in the microstrip transmission line. The open-circuit stub is a short at 60 GHz to suppress the RF signal at the output.

The λ/2 line serves a three-fold purpose. First, it serves as a half-wavelength resonator, boosting the amplitude of the LO signal. Second, the line is a phase shifter between the RF and LO ports, which is used to enable FSK demodulation. Third, it imposes a 180° phase shift between the RF and LO ports (taking into account the loading effect of the transistors), which reduces LO feed through to the output by producing destructively interfering current signals at 60 GHz to the output.

A mode of the demodulator can be in an OOK receiver, in which case its amplitude detection capability from (14) can be utilized. In the case of a frequency modulated signal, the λ/2 line can function as a frequency dependent phase shifter and enables the demodulation of FSK type modulation schemes. Additionally, the detector can perform edge detection on a DBPSK signal by exploiting non-idealities in the modulated waveform.

Figure 22:
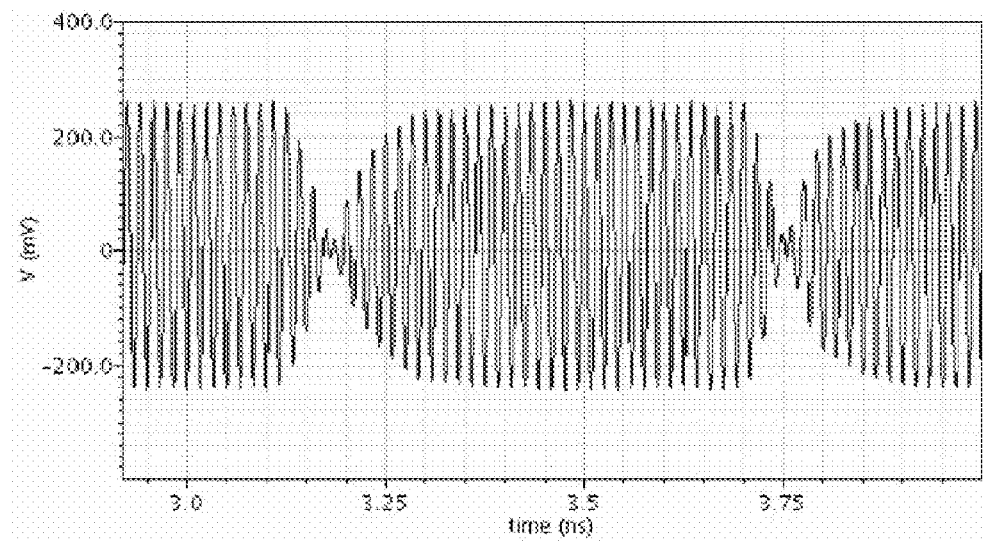
FIG. 22 illustrates a graphical representation of a BPSK waveform showing the amplitude distortion from phase changes, in accordance with an exemplary embodiment of the present invention.
Figure 23:
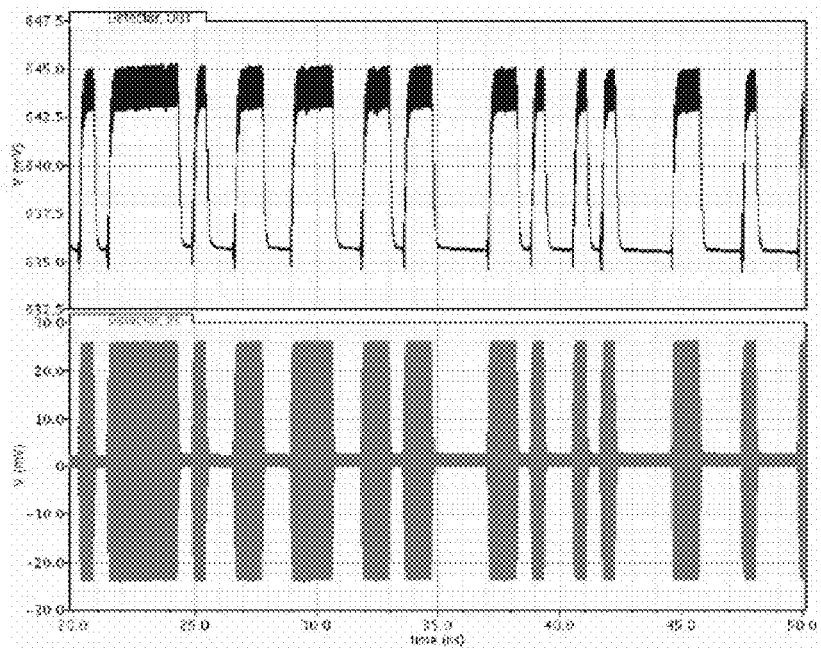
FIG. 23 illustrates a graphical representation of a simulation, showing the detector input and output for an approximate −22 dBm, in accordance with an exemplary embodiment of the present invention.

FIG. 22 illustrates BPSK waveforms that exhibit a non constant envelope, with a dip in amplitude during a phase transition corresponding to a bit edge.

Because one function of the demodulator includes amplitude detection, these bit edges can be captured. Because the edges are detected, and not the actual bits, the digital data can be differentially encoded, whereby the information is stored in the bit transitions. In this fashion, the detector, when used with a differential decoder, can demodulate DBPSK signals.

Figure 24:
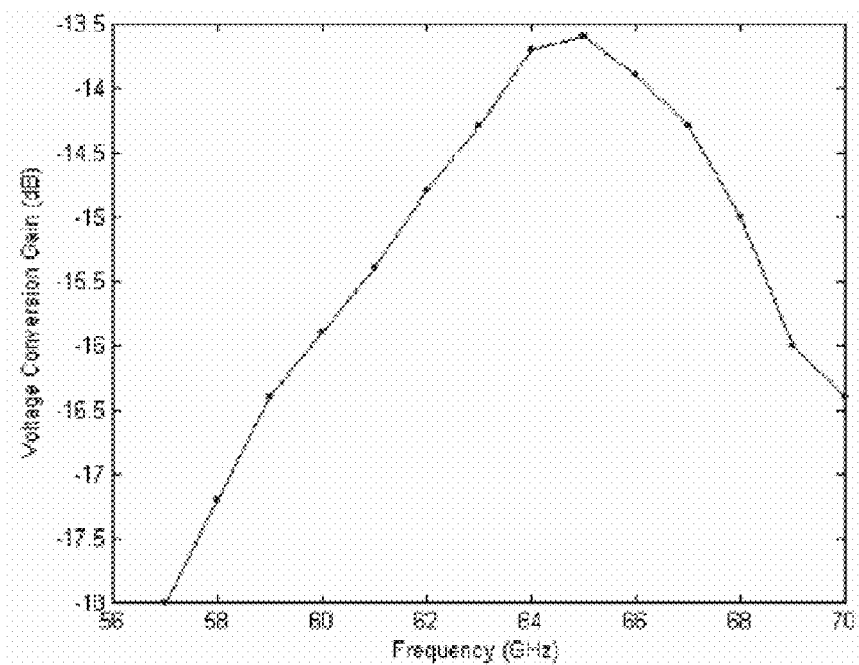
FIG. 24 illustrates a graphical representation of a detector conversion gain versus input frequency for an approximate −22 dBm input signal, in accordance with an exemplary embodiment of the present invention.

FIG. 24 shows a simulated result showing the detector input and output for an approximate 61 GHz carrier modulated by an approximate 1.728 Gbps OOK data. The signal power at the detector input is about −22 dBm, or about 50 mV peak to peak on a 50Ω system. The output swing can be about 8.4 mV pk-pk, indicating an approximate 15.5 dB conversion loss. The high bits can include the 61 GHz feed through, which can be removed by the low pass nature of the subsequent receiver stages.

Figure 25:
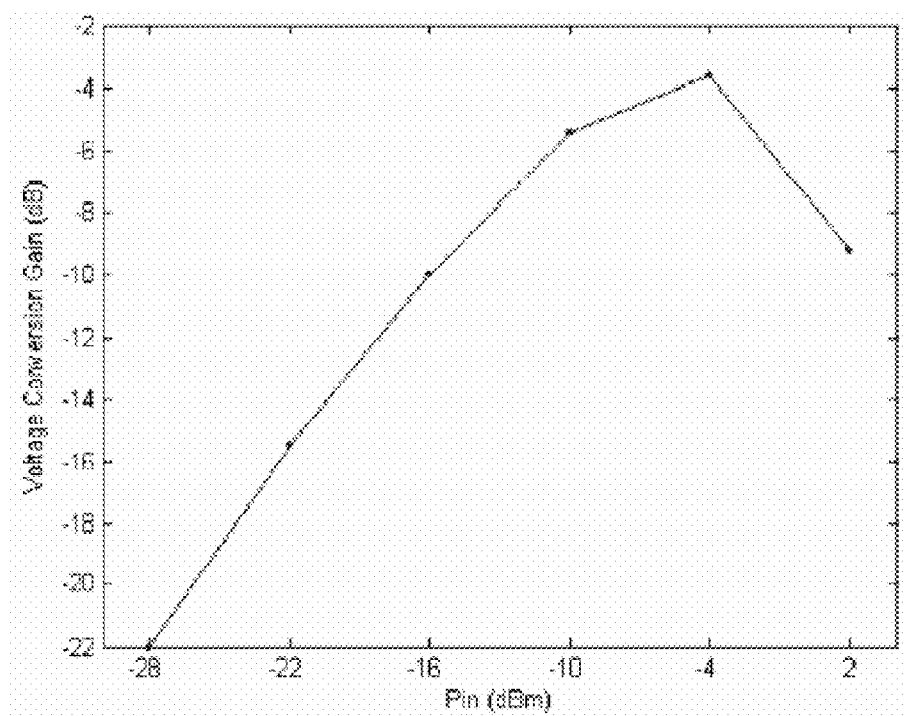
FIG. 25 illustrates a graphical representation of a detector conversion gain versus input power for an approximate 61 GHz carrier, in accordance with an exemplary embodiment of the present invention.
Figure 26:
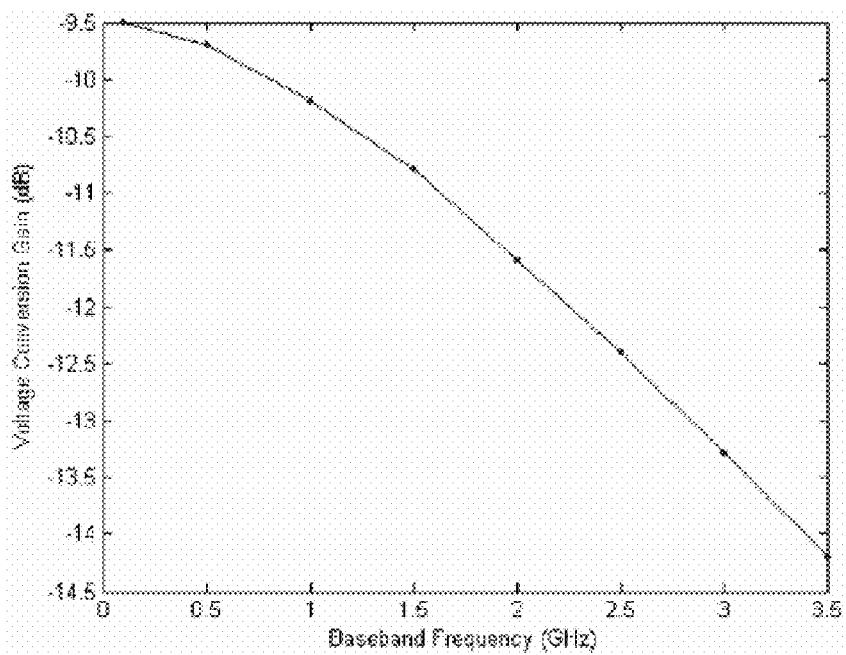
FIG. 26 illustrates a graphical representation of a detector output frequency response for an approximate −16 dBm, 61 GHz carrier, in accordance with an exemplary embodiment of the present invention.

FIGS. 24 and 25 show the detector conversion gain with respect to input frequency and power, respectively. The results shown in FIG. 25 are consistent with the prediction of equation (17). FIG. 26 shows the output frequency response of the detector. It also indicates that an approximate 4 dB Bandwidth of approximately 2 GHz is sufficient to support an approximate 1.728 Gbps OOK signal.

Figure 27:
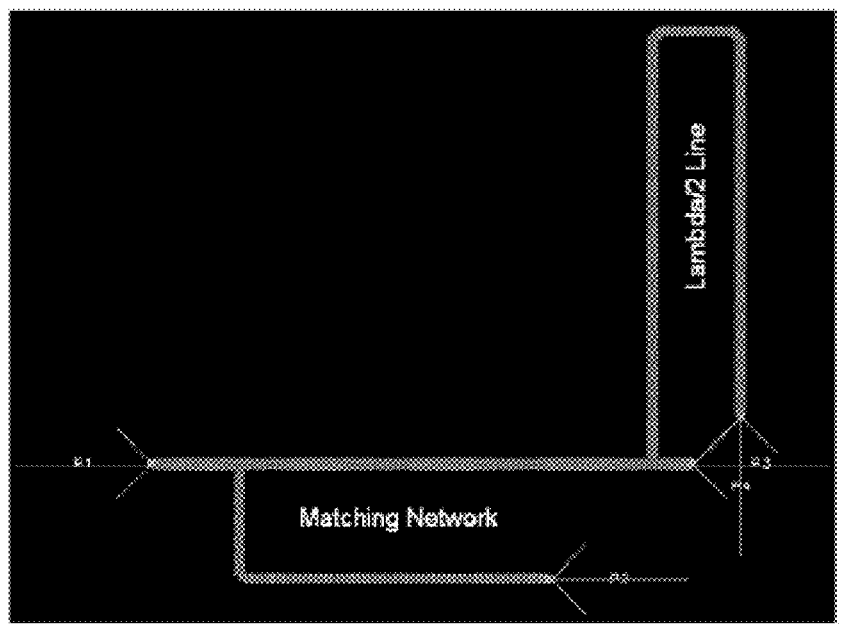
FIG. 27 illustrates a Momentum simulation setup for millimeter wave lines, in accordance with an exemplary embodiment of the present invention.

In a simulation, full-wave electromagnetic simulations were performed using Momentum on transmission lines in the design. FIG. 27 shows the Momentum setup for the detector input matching and phase shift networks. From these simulations, s-parameter blocks were generated and used in conjunction with Agilent Advanced Design System (ADS) and Cadence schematic setups.

Figure 28:
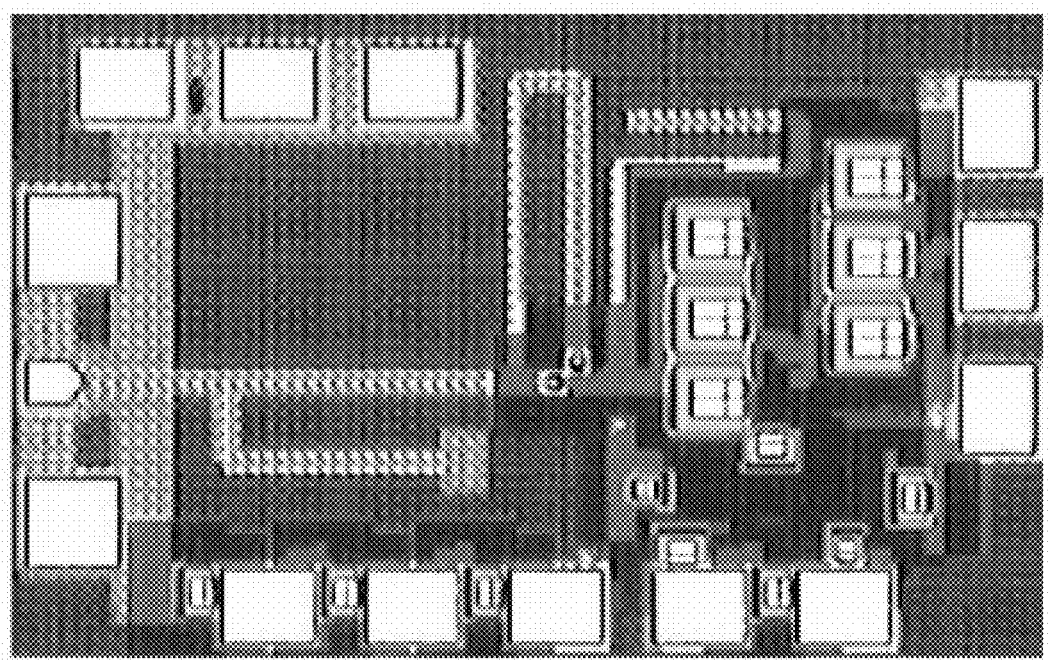
FIG. 28 illustrates a top view of a chip microphotograph of the fabricated detector system, in accordance with an exemplary embodiment of the present invention.

FIG. 28 shows the detector fabricated with an output buffer included. In some embodiments, the detector consumes about 4.5 mA from an approximate 1.9 V supply.

Figure 29:
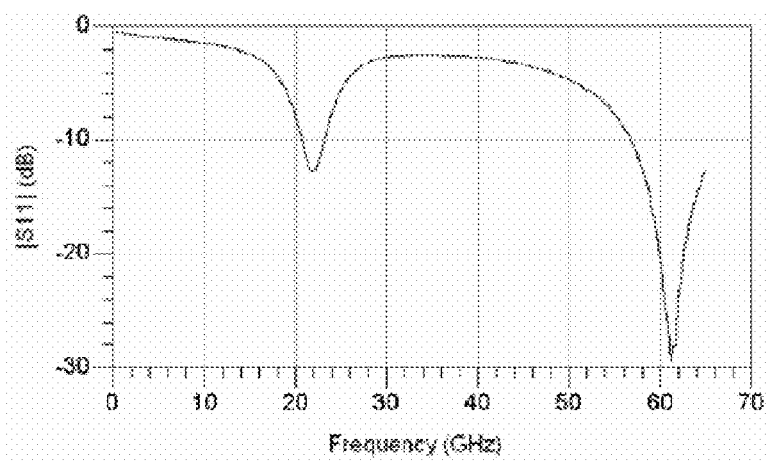
FIG. 29 illustrates a graphical representation of measured $|S_{11}|$ of the detector system, in accordance with an exemplary embodiment of the present invention.

FIG. 29 shows the measured $|S_{11}|$ of the detector. A 10 dB match can be achieved from a frequency of 57 GHz to greater than 65 GHz. At the time of these measurements, a 60 GHz modulated source was not available and therefore the demodulation capabilities of the detector could not be verified.

Once the input signal has been demodulated, it can comprise a train of analog pulses representing binary data. In some embodiments, it is preferable to amplify the waveform, before digitizing it.

FIG. 30 shows an amplifier for the demodulator system. A large gain can be generated from a low supply voltage—to help conserve power consumption perspective. Accordingly, a multi-stage configuration can be implemented used. Because this circuit can operate at baseband e.g., below about 4 GHz, many interstage AC coupling capacitors may have to be large in area, as the modulation scheme is not totally DC-free, and may be avoided because parasitic capacitance to ground causes prohibitive bandwidth loss. Therefore, because DC coupling can be used, differential architecture is used to mitigate DC offset issues.

Figure 31:
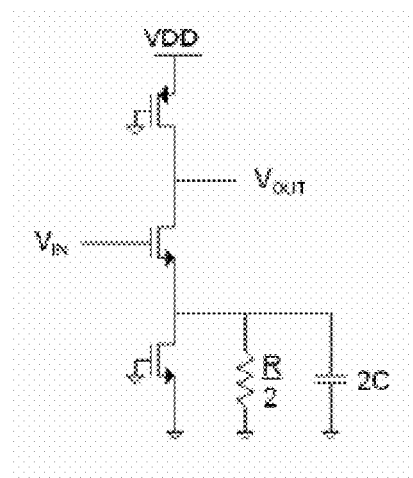
FIG. 31 illustrates a schematic of a baseband amplifier second stage half-circuit equivalent, in accordance with an exemplary embodiment of the present invention.

The first stage of the amplifier can include a single to differential ended converter, which can be implemented by AC grounding one input terminal of a differential amplifier. The PMOS load can be biased through resistors at the output, which can provide a common mode feedback to the output bias and can be adjusted to tune gain versus bandwidth. The second stage is a differential to single ended circuit with a PMOS current-minor load and a parallel RC gain peaking network at the source of the input devices. Half circuit analysis using the circuit of FIG. 31 shows that the RC network creates approximately zero in the effective transconductance of the second stage. This can create a peaking effect in the second stage that can be tuned to extend the bandwidth of the amplifier.

$$G_m = \frac{gm}{1 + gm\left(\frac{R}{2} \parallel \frac{1}{2C_s}\right)} \tag{18}$$

$$= \frac{gm(RCs + 1)}{RCs + 1 + \frac{gmR}{2}} \tag{19}$$

The final stage can include a buffer to drive a large capacitor at the output, which may have a large parasitic capacitance to ground and therefore presents a low impedance, e.g., when compared to conventional devices.

Figure 32:
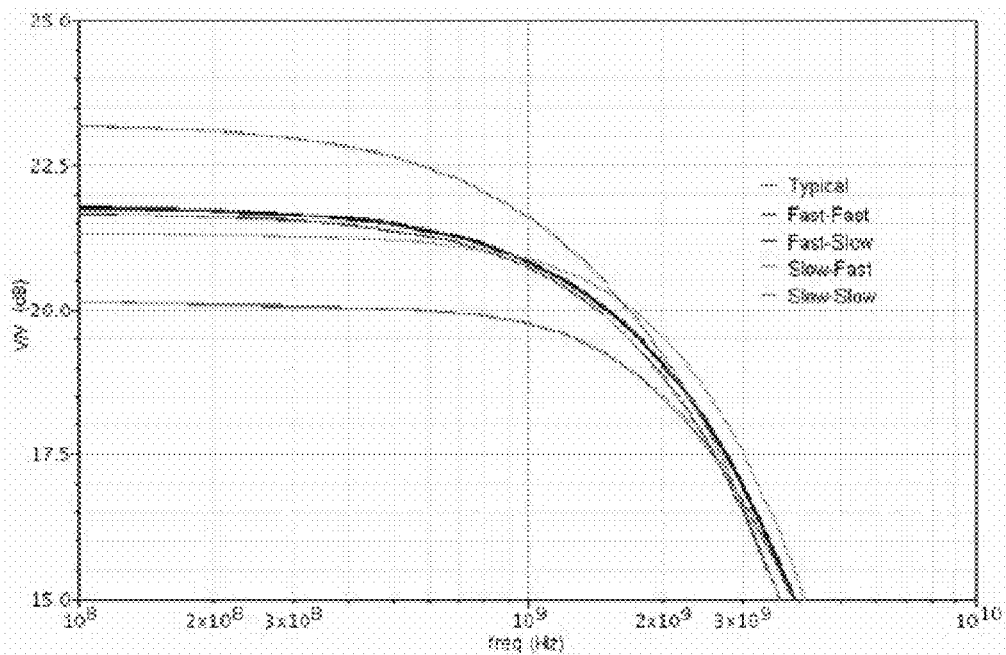
FIG. 32 illustrates a graphical representation of a baseband amplifier AC response over process variation, in accordance with an exemplary embodiment of the present invention.
Figure 33:
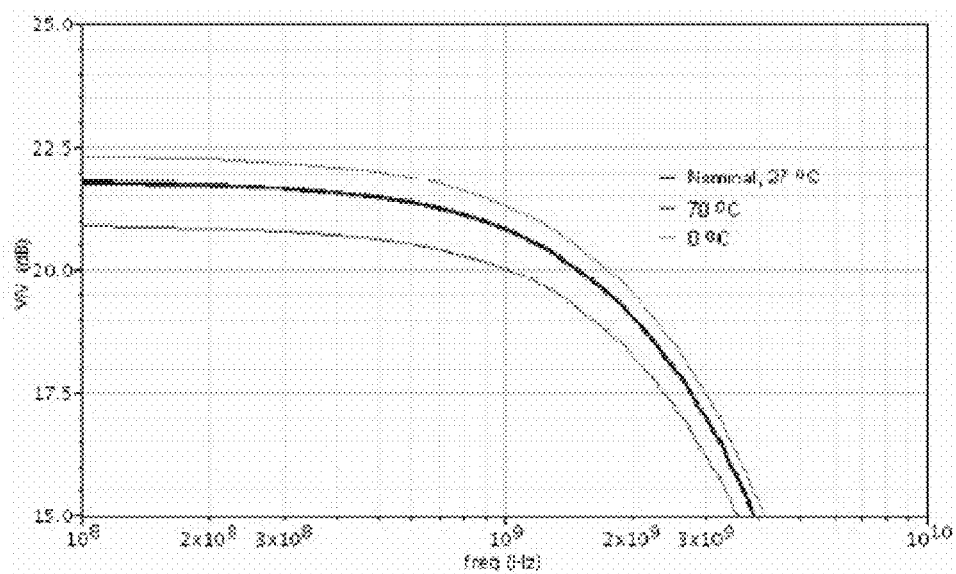
FIG. 33 illustrates a graphical representation of a baseband amplifier AC response over temperature variation, in accordance with an exemplary embodiment of the present invention.

The nominal simulated voltage gain of the amplifier is about 21.8 dB with a 2.1 GHz 4-dB bandwidth. It can consume about 7.9 mA of current from an approximate 1 V supply. FIGS. 32 and 33 show the amplifier performance over process and temperature variation, respectively. Table II summarizes these results.

TABLE II

Baseband amplifier performance summary over process and temperature

|  | Gain (dB) | BW (GHz) | DC Power (mW) |
| --- | --- | --- | --- |
| Typical, 27° C. | 21.8 | 2.2 | 7.9 |
| FF | 20.1 | 2.8 | 8.8 |
| FS | 20.7 | 2.1 | 7.4 |
| SF | 21.4 | 2.7 | 8.4 |
| SS | 24.2 | 1.6 | 7.1 |
| 0° C. | 22.4 | 2.1 | 7.5 |
| 70° C. | 20.9 | 2.2 | 8.7 |

At this point in the receiver chain, the signal is in the analog domain. Hence, the waveform at the output of the baseband amplifier comprises a train of analog pulses representing binary data. Accordingly, an analog to digital converter (ADC) is necessary so that the recovered data can be processed in the digital domain.

Figure 34:
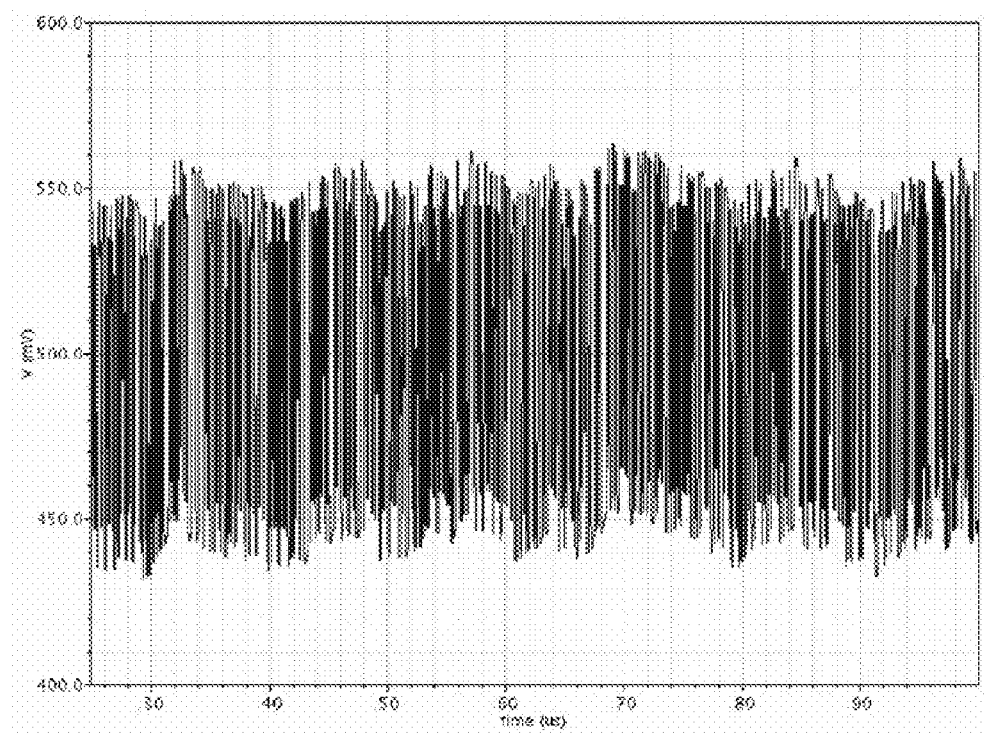
FIG. 34 illustrates an envelope movement at an input of an analog to digital converter (ADC), in accordance with an exemplary embodiment of the present invention.

The input to the ADC is a non-periodic analog waveform of pulses representing binary data. For long streams of "ones" or "zeros," the envelope of the analog waveform can drift. This effect can be observed in FIG. 34 where the ADC is fed with a pseudo random bit sequence (PRBS). For small amplitude inputs, this envelope movement can become relatively appreciable in magnitude. The ADC can include a certain swing above or below its trip point to be able to successfully capture a bit. If, for example, the top side of the envelope drifts below this threshold the analog to digital conversion can be unsuccessful. Based upon estimates of the sparsity of ones or zeros resulting from random input data at a given rate, the minimum amplitude for safe conversion can be determined. For a circuit at about 800 Mbps, that amplitude can be approximately 100 mV pk-pk, or about −16 dBm on a 50Ω system. Faster data rates can cause less envelope movement.

Figure 35:
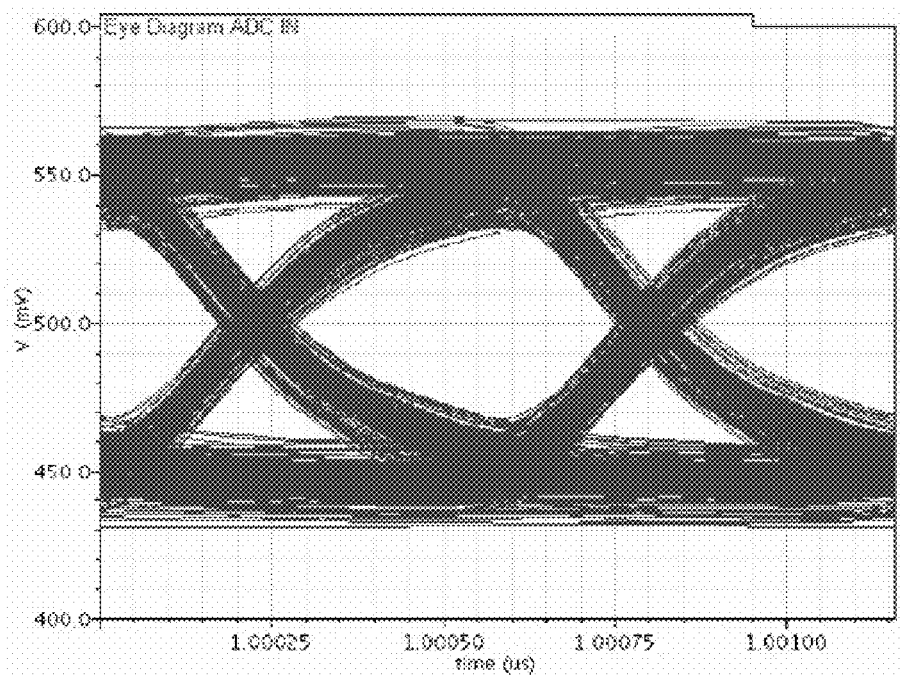
FIG. 35 illustrates a graphical representation of an eye diagram at the ADC input for an approximate 1.728 Gbps PRBS signal, in accordance with an exemplary embodiment of the present invention.
Figure 36:
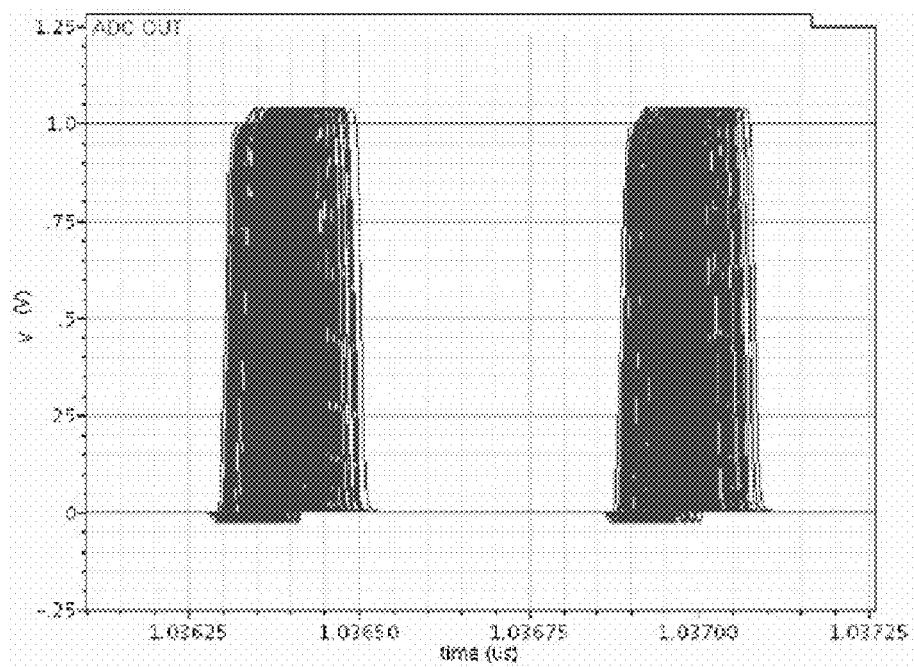
FIG. 36 illustrates a graphical representation of an eye diagram at the ADC output for an approximate 1.728 Gbps PRBS signal, in accordance with an exemplary embodiment of the present invention.

This envelope movement in the analog domain can manifest itself as jitter in the digital domain. FIGS. 35 and 36 illustrate eye diagram plots at the ADC input and output, respectively. A large portion of this jitter can be removed by a clock and data recovery (CDR) circuit, as further described below.

One purpose of a CDR circuit is to generate a clock signal with a period approximately equal to the data rate of a stream of an unclocked digital data. Typically, the input data can then be sampled or "re-clocked" so that both clock and data signals can be "recovered." This reclocking can be used to reduce the jitter of a noisy input signal. The data signal and associated clock can now be used to drive a digital signal processor (DSP) in the back end. FIG. 37 is a simple block diagram of an exemplary CDR system.

As shown in FIG. 37, the CDR system includes a data in input. The data in input is fed to a clock recovery system and a D-flip-flop. The data in input is fed to the D of the D-flip-flop. An output of the clock recovery is also coupled to the D-flip-flop, and is also a clock out signal. The D-flip-flop includes at least four connections, a D connection, a Q connection, a clock connection and a $\overline{Q}$ connection. The data in input is coupled to the D connection. The Q connection is an output of the D-flip-flop, i.e., the data out. The output of the clock recovery system is coupled to the clock connection. The D-flip-flop is the most common flip-flop in use today. In some embodiments, the D-flip-flop is better known as delay flip-flop (as its output Q looks like a delay of input D) or data latch. The Q output takes on the state of the D input at the moment of a positive edge at the clock pin (or negative edge if the clock input is active low). Hence, it is called the D-flip-flop for this reason, because the output takes the value of the D input or Data input, and Delays it by maximum one clock count.

Components for a proposed multi-gigabit 60 GHz receiver in 90 nm CMOS have been described herein. System level analyses based upon the results of individually designed components have verified the feasibility of such a system. A 60 GHz low noise amplifier, 60 GHz direct-conversion demodulator, and baseband amplifier can be included in the receiver system, for example, using the STMicroelectronics 90 nm RFCMOS design kit.

In an exemplary embodiment of the present invention, a demodulator system is configured for demodulation of an approximate 2.5 Gbps minimum shift keying (MSK) signal at about 8.05 GHz center frequency, or an approximate 1.25 Gbps differential binary shift keying (DBPSK) signal at about 7.4 GHz with the same circuit. The 8.05 GHz IF can be selected, in some embodiments, as the optimum tradeoff between a cleaner discriminator operation at higher frequencies and a more practical IF amplifier design at lower frequencies. The system is configured to demodulate an input voltage swing as low as ±8 mV and as high as ±60 mV. In some embodiments, the demodulator system consumes approximately 24 mW of DC power.

Figure 38:
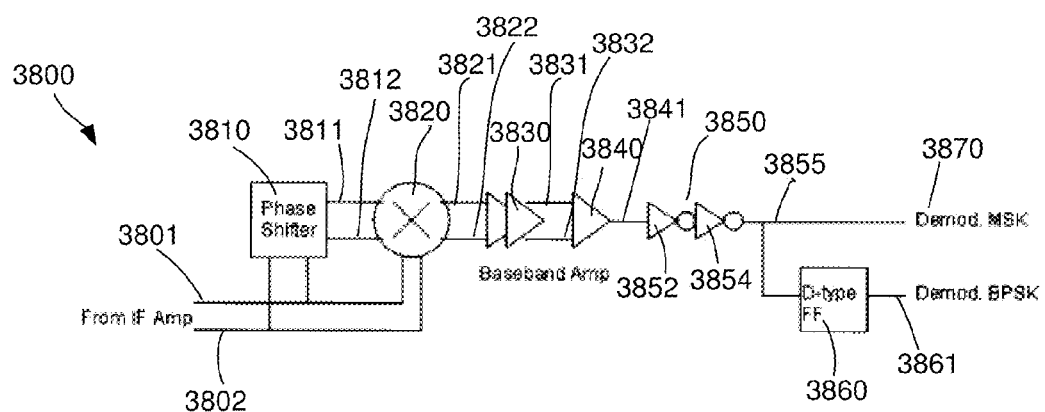
FIG. 38 illustrates a schematic block diagram of a demodulator system, in accordance with an exemplary embodiment of the present invention.

The demodulator system includes a mixer, a baseband amplifier, and a dual inverter stage system. The mixer of the demodulator system consumes approximately 2.4 mW, the baseband amplifier approximately 21.1 mW, and the dual inverter stage system approximately less than 1 mW. A block diagram of the demodulator system is illustrated in FIG. 38.

The demodulator system (including, in some embodiments, the demodulator system 520 as illustrated in FIG. 5) can include a plurality of components. In some embodiments, the demodulator system 3800 of FIG. 38 includes a phase shifter 3810, a mixer 3820, baseband amplifier 3830, an amplifier 3840, a dual inverter stage system 3850, and a D-type flip flop 3860.

In some embodiments, the demodulator system 3800 can receive a pair of signals 3801 and 3802 from an IF amplifier. The signals 3801 and 3802 are in communication with both the phase shifter 3810 and the mixer 3820. In some embodiments, the signals 3801 and 3802 are inputs to both the phase shifter 3810 and the mixer 3820.

The phase shifter 3810 is adapted to shift the phases of the inputs 3801 and 3802. The phase shifted signals 3811 and 3812 exiting the phase shifter are also inputs to the mixer 3820. The four signals—3801, 3802, 3811, and 3812—are mixed by the mixer 3820. The mixer 3820 can multiply its input signals to generate two outputs 3821 and 3822. The outputs 3821 and 3822 of the mixer 3820 are in communication with a baseband amplifier filter 3830. The baseband amplifier filter 3830 amplifies its inputs and generates two outputs 3831 and 3832. The two outputs 3831 and 3832 are further amplified by amplifier 3841 to generate a single output 3841. The single output 3841 of the amplifier 3840 is fed to the dual inverter stage system 3850. In an exemplary embodiment, the dual inverter stage system includes a pair of back to back inverters 3852 and 3854. An output 3855 of the dual inverter stage system 3850 can be provided as a demodulated MSK signal 3870. In addition, the output 3855 is fed to the D-flip-flop 3860, which has an output 3861 as a demodulated BPSK signal.

Figure 39:
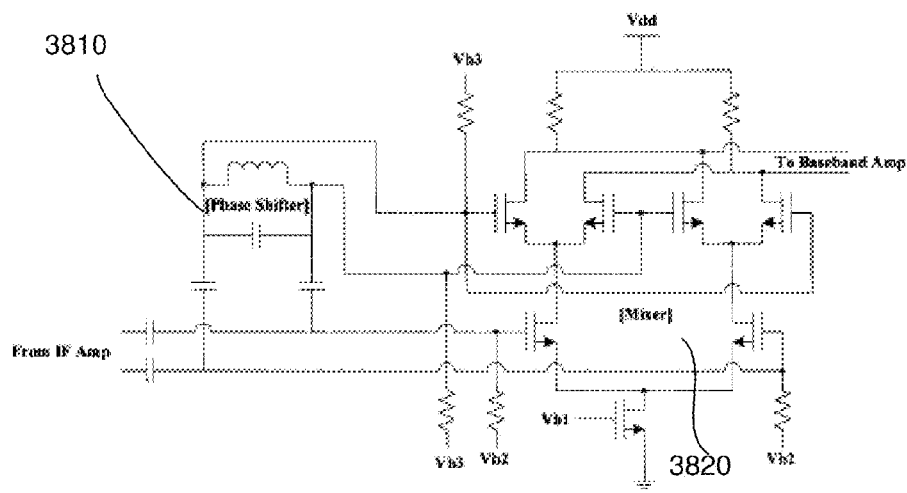
FIG. 39 illustrates a transistor level schematic of a phase shifter and mixer elements of the demodulator system of FIG. 38, in accordance with an exemplary embodiment of the present invention.

FIG. 39 shows a transistor level schematic of the phase shifter and mixer elements of the demodulator system 3800 of FIG. 38. Among other things, FIG. 39 illustrates the connection of the phase shifter 3810 and the mixer to the IF amplifier, as well the output connection of the mixer to the baseband amplifier 3830.

The demodulator system of embodiments of the present invention has many advantages over conventional solutions. For example and not limitation, the demodulator system (1) when incorporated with the developed 60 GHz CMOS front end, it enables a 2.5 Gb/s MSK or 1.25 Gb/s DBPSK wireless transmission through the 57-64 GHz band with the same circuit; (2) very low power consumption—less than about 25 mW; and (4) demodulation is non-coherent, therefore, no synchronization scheme is necessary.

The normalized input impedance of the demodulator system is very low for the center frequency. In some embodiments, this is caused by the parallel combination of large mixer input gates via the phase shifting resonator. This can load the IF amplifier and cause a considerable loss in gain, driving the input voltage of the detector below operational levels.

In order to combat these challenges, exemplary embodiments can include cascaded differential IF amplifiers with bandpass responses centered at about 8 GHz. Unfortunately, this approach also has a drawback—numerous inductors are necessary to achieve this response. Other potential solutions include integrating the phase shifting resonator at the input of the detector with the final IF amplifier stage to reduce, or further eliminate, at least one inductor. This can increase the input impedance of the detector, but the cost can be more power consumption in the mixer and may prohibit sub-threshold operation.

In certain experiments, the inventors have tested transient simulation outputs for the demodulator system, tested independently of the IF amp with MSK modulation for different bit rates, input signal levels, and baseband amplifier configurations. The inventors discovered that the system operates for an approximate 2.5 Gbps at a about ±9 mV input voltage swing, but performance can degrade at about 4 Gbps for the same input swing. By using a degenerated amplifier configuration the approximate 4 Gbps signal can be recovered because group delay increases the magnitude of the single-bit spikes and allows the dual-inverter stage to recover the signal successfully. But as the input swing is increased, the overshoots may become more severe and may not prove advantageous.

The inventors also tested the demodulator system independently of the IF amp for DBPSK modulation. They discovered that the system operates for an approximate 1.45 Gbps at about ±8 mV input voltage swing—these results were found using the degenerated baseband amplifier. Use of the normal amplifier configuration results in lower passable data rates. An additional (i.e., parallel) stage can be implemented if needed to recover the binary data from the generated spikes for the DBPSK case. This can be implemented with a single D-type flip-flop in a feedback configuration.

Figure 40:
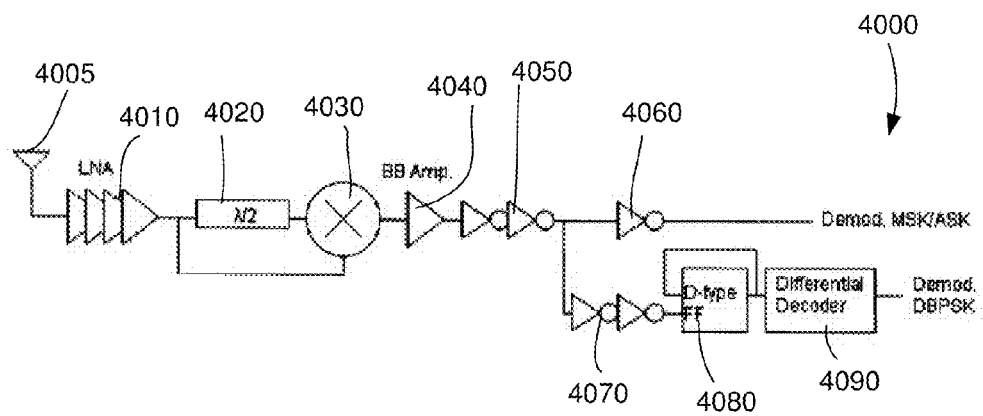
FIG. 40 illustrates a schematic of a receiver system, in accordance with an exemplary embodiment of the present invention.

FIG. 40 illustrates an exemplary embodiment of the receiver system. There are many advantages of the receiver system and the demodulator system over the conventional systems. For example and not limitation, some advantages include (1) enabling Gbps MSK, DBPSK, or ASK reception and demodulation in the unlicensed 57-64 GHz band with the same circuit; (2) low power consumption, e.g., approximately 94 mW; and (4) demodulation is non-coherent therefore no carrier synchronization scheme is required.

The receiver system 4000 includes an antenna 4005, a low noise amplifier 4010, a divider 4020, a mixer 4030, a baseband amplifier 4040, a first inverter system 4050, a inverter 4060, a second inverter system 4070, a D-flip-flop 4080, and a differential decoder system 4090.

In the receiver system 4000 shown in FIG. 40, a wireless signal can be received by the antenna 4005. In some embodiments, the antenna 4005 can be calibrated to receive a wireless signal being transmitted within a range of approximately 55 GHz to approximately 66 GHz. In some embodiments, the antenna 4005 can be calibrated to receive a wireless signal being transmitted at about 60 GHz. The received signal is transmitted from the antenna 4005 to a first low noise amplifier 4010.

The low noise amplifier 4010 is adapted to amplify the received signal from the antenna 4005. An output of the low noise amplifier 410 can be in communication with a λ/2 line 4020, in some embodiments can be a divider, and a mixer 4030. The output of the divider 4020 can be mixed with the output of the low noise amplifier 4010 by the mixer 4030. The output of the mixer 4030 can be fed to an input of the baseband amplifier 4040 to amplify the signal. The output of the baseband amplifier 4040 can be fed to an inverter system 4050. In some embodiments, the inverter system 4050 can include a pair of cascaded NOT systems. The output of the inverter 4050 can be fed through another inverter 4060, which outputs a demodulated MSK/ASK signal. The output of the inverter 4050 can be fed through another inverter system 4070, which again can include a pair of cascaded inverters. The output of the inverter system 4070 can also be in communication with the D-flip-flop 4080. A first output of the D-flip-flop can be in communication with a second output. The first and second outputs of the D-flip-flop can be in communication with a differential decoder 4090. The output of the differential decoder is a demodulated DBPSK signal.

Figure 41:
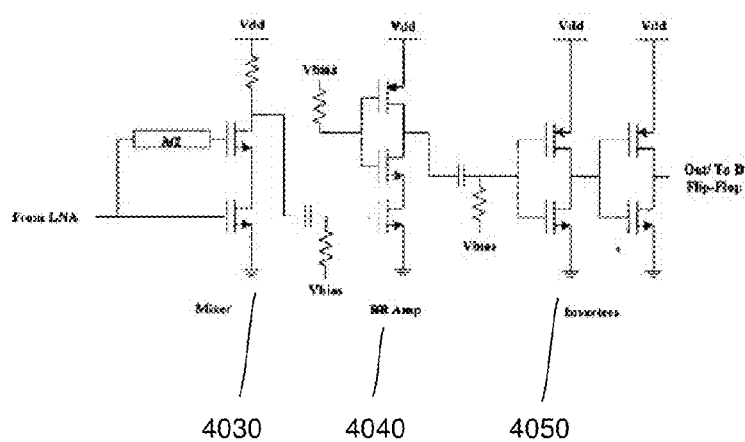
FIG. 41 illustrates a schematic of parasitic elements of the receiver system of FIG. 40, in accordance with an exemplary embodiment of the present invention.

FIG. 41 illustrates a schematic of the receiver system 4000 of FIG. 40 with its parasitic components. In particular, FIG. 41 illustrates parasitic elements of the mixer 4030, the baseband amplifier 4040, and the inverter 4050.

Figure 42:
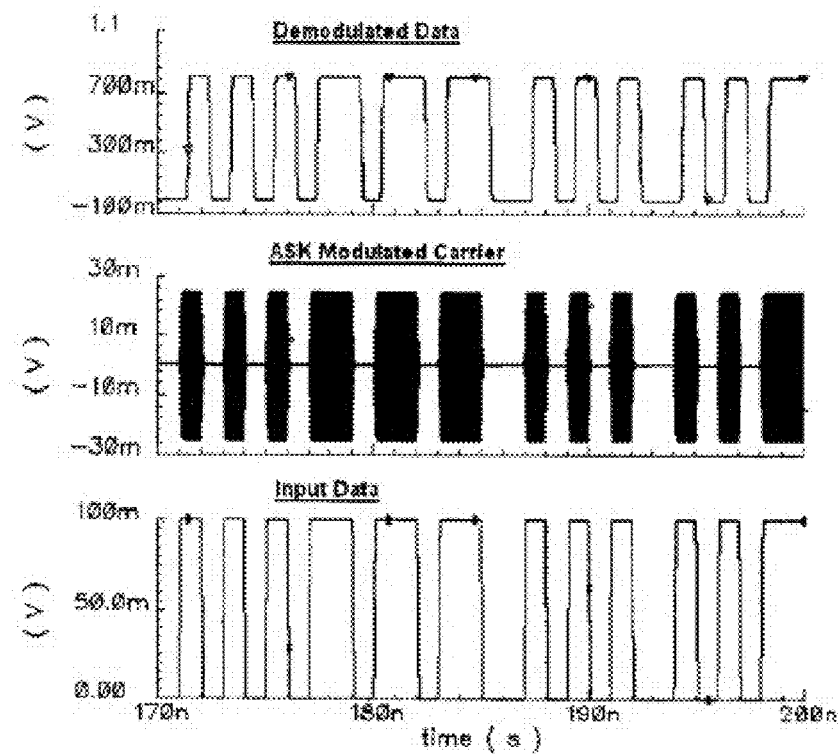
FIG. 42 illustrates a graphical representation of a transient simulation output for the demodulator system of FIG. 38, for an approximate 1 Gbps ASK modulated data, in accordance with an exemplary embodiment of the present invention.

FIG. 42 illustrates transient simulation outputs for the demodulator, for 1 Gbps ASK modulated data. The inventors successfully proved demodulation for an approximate −22 dBm power level at the output of the LNA.

Figure 43:
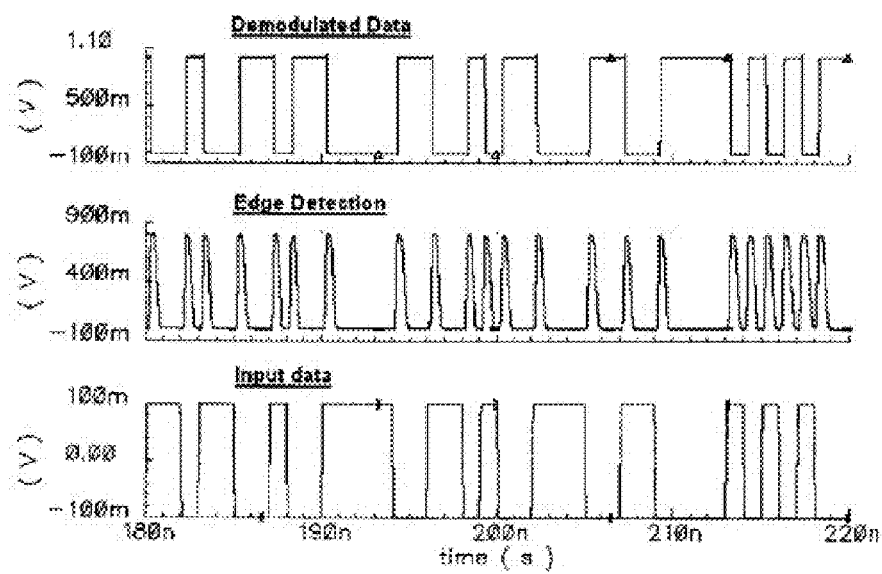
FIG. 43 illustrates a graphical representation of transient simulation outputs for the demodulator system of FIG. 38, for an approximate 1 Gbps DBPSK modulated data, in accordance with an exemplary embodiment of the present invention.

FIG. 43 shows transient simulation outputs for the demodulator, for an approximate 1 Gbps DBPSK modulated data. An additional (i.e., parallel) stage may be needed to recover the binary data from the voltage spikes generated at bit transitions. In some embodiments, this can be accomplished with a single D-type flip-flop in a feedback configuration. The inventors successfully demonstrated demodulation for an approximate −22 dBm power level at the output of the LNA.

Figure 44:
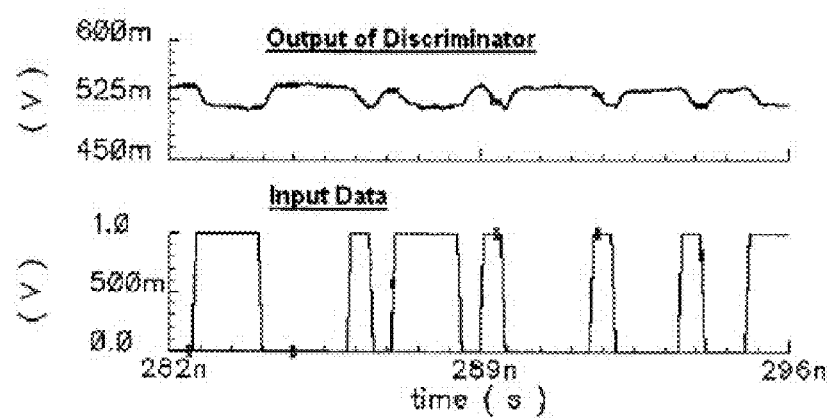
FIG. 44 illustrates a graphical representation of transient simulation outputs for the demodulator system of FIG. 38, for about 2 Gbps MSK modulated data, in accordance with an exemplary embodiment of the present invention.

FIG. 44 shows transient simulation outputs for the demodulator, for about 2 Gbps MSK modulated data. The inventors successfully demonstrated demodulation for an approximate −19 dBm power level at the output of the LNA.

While exemplary embodiments of the invention have been disclosed many modifications, additions, and deletions can be made therein without departing from the spirit and scope of the invention and its equivalents, as set forth in the following claims. In addition, the quantities of various features of embodiments of the present invention are provided for illustrated embodiments and are exemplary. The scope of the various embodiments of the present invention should not be limited to the above discussed embodiments or quantity values, and should only be defined by the following claims and all applicable equivalents.

What is claimed is:

1. A receiver system comprising:
   an antenna configured to receive an analog wireless signal;
   a low noise amplifier adapted to amplify the analog wireless signal and to generate an amplified analog signal;
   a demodulator system configured to detect the analog characteristics of the amplified analog signal and adapted to generate a demodulated analog signal;
   a baseband amplifier adapted to amplify the demodulated analog signal;
   an analog to digital converter configured to convert the amplified, demodulated analog signal to a digital signal; and
   a clock and data recovery system configured to receive the converted signal,
   wherein the demodulator system comprises:
     a mixer system adapted to multiply a plurality of inputs and to generating a mixer output;
     a baseband amplifier configured to amplify the mixer output; and
     a pair of serially connected inverters for inverting an amplified baseband output being outputted from the baseband amplifier to form the demodulated analog signal.

2. The receiver system of claim 1, the analog wireless signal operating at approximately 60 GHz.

3. The receiver system of claim 1, the clock and data recovery system comprising a digital output and a clock output.

4. The receiver system of claim 1, the receiver system adapted for direct conversion demodulation of a gigabit per second minimum shift keying signal with an approximate 61 GHz carrier.

5. The receiver system of claim 1, the receiver system adapted for direct conversion demodulation of a gigabit per second differential binary shift keying signal with an approximate 61 GHz carrier.

6. The receiver system of claim 1, the receiver system adapted for direct conversion demodulation of a gigabit per second amplitude shift keying signal with an approximate 61 GHz carrier.

7. The receiver system of claim 1, the receiver system adapted for direct conversion demodulation of a gigabit per second minimum shift keying, differential binary shift keying, or amplitude shift keying signal with an approximate 61 GHz carrier.

8. The receiver system of claim 7, the receiver system adapted at gigabit per second minimum shift keying, differential binary shift keying, or amplitude shift keying reception and demodulation in the unlicensed 57-64 GHz band.

9. The receiver system of claim 1, the receiver system consuming less than approximately 73 mW of power in operation.

10. The receiver system of claim 1, wherein the demodulator system is non-coherent.

11. The demodulator system of claim 1, the demodulator system adapted for the direct-conversion demodulation of one of minimum shift keying, differential binary phased shift keying, or amplitude shift keying modulated data on an approximate 61 GHz carrier in a single analog CMOS device.

12. A demodulator system comprising:
a phase shifter configured to shift the phase of one or more inputs and providing at least one phase shifted output;
a mixer configured to multiply one or more inputs with the at least one phase shifted output and providing at least one mixer output;
a baseband amplifier configured to amplify the at least one mixer output and generating at least one baseband amplified output; and
an inverter system configured to invert the at least one baseband amplified output;
wherein a demodulated minimum shift keying signal is a first output of the demodulated system; and
wherein a binary phase shift keying signal is a second output of the demodulated system.

* * * * *